United States Patent
Bang et al.

(10) Patent No.: US 11,961,794 B2
(45) Date of Patent: Apr. 16, 2024

(54) METHOD OF FORMING A MOLDED SUBSTRATE ELECTRONIC PACKAGE AND STRUCTURE

(71) Applicant: Amkor Technology Singapore Holding Pte. Ltd., Valley Point (SG)

(72) Inventors: Won Bae Bang, Gyeonggi-do (KR); Byong Jin Kim, Gyeonggi-do (KR); Gi Jeong Kim, Gyeonggi-do (KR); Ji Young Chung, Gyeonggi-do (KR)

(73) Assignee: Amikor Technology Singapore Holding Pte. Ltd., Singapore (SG)

( * ) Notice: Subject to any disclaimer, the term of this patent is extended or adjusted under 35 U.S.C. 154(b) by 658 days.

(21) Appl. No.: 17/130,182

(22) Filed: Dec. 22, 2020

(65) Prior Publication Data

US 2021/0106156 A1 Apr. 15, 2021
US 2023/0240457 A9 Aug. 3, 2023

Related U.S. Application Data

(62) Division of application No. 15/888,003, filed on Feb. 3, 2018, now Pat. No. 10,910,298, which is a division
(Continued)

(30) Foreign Application Priority Data

Mar. 20, 2015 (KR) .................. 10-2015-0038902

(51) Int. Cl.
*H01L 23/495* (2006.01)
*A47G 9/02* (2006.01)
(Continued)

(52) U.S. Cl.
CPC ...... *H01L 23/49827* (2013.01); *A47G 9/0253* (2013.01); *A47G 9/10* (2013.01);
(Continued)

(58) Field of Classification Search
CPC ........... H01L 23/49827; H01L 21/4828; H01L 21/486; H01L 23/3128; H01L 23/49861;
(Continued)

(56) References Cited

U.S. PATENT DOCUMENTS 6,975,022 B2  12/2005  Sakamoto et al.
7,476,972 B2  1/2009  Takahashi
(Continued)

FOREIGN PATENT DOCUMENTS

KR  10-2004-0065308 A  7/2004
KR  1020090085258 A  8/2009
(Continued)

OTHER PUBLICATIONS

Office Action received from Korean Patent Office in Korean; English Translation Not Available; dated Jan. 1, 2016; 11 pages.
(Continued)

*Primary Examiner* — Caleb E Henry
*Assistant Examiner* — Dilinh P Nguyen
(74) *Attorney, Agent, or Firm* — Kevin B. Jackson

(57) ABSTRACT

An electronic package includes a substrate having a plurality of lands embedded within an insulating layer. Conductive patterns are disposed on at least a portion of a respective land top surface. An electronic device is electrically connected to the conductive patterns, wherein the land bottom surfaces are exposed to the outside. In another embodiment, the top land surfaces and the top surface of the insulating layer are substantially co-planar and the conductive patterns further overlap portions of the top surface of the insulating layer. In one embodiment, a package body encapsulates the top surface of the insulating material and the electronic device, wherein the land bottom surfaces are exposed to the outside of the package body.

20 Claims, 25 Drawing Sheets

Related U.S. Application Data of application No. 14/984,064, filed on Dec. 30, 2015, now Pat. No. 9,922,919.

(51) Int. Cl.
*A47G 9/10* (2006.01)
*H01L 21/48* (2006.01)
*H01L 23/31* (2006.01)
*H01L 23/498* (2006.01)

(52) U.S. Cl.
CPC ........ *H01L 21/4828* (2013.01); *H01L 21/486* (2013.01); *H01L 23/3128* (2013.01); *H01L 23/49861* (2013.01); *A47G 2009/1018* (2013.01); *H01L 23/49816* (2013.01); *H01L 2224/16225* (2013.01); *H01L 2924/181* (2013.01)

(58) Field of Classification Search
CPC ..... H01L 23/49816; H01L 2224/16225; H01L 2924/181
USPC .......................................................... 257/668
See application file for complete search history.

(56) References Cited

U.S. PATENT DOCUMENTS

| | | |
|---|---|---|
| 8,822,281 B2 | 9/2014 | Pagaila |
| 2006/0162956 A1* | 7/2006 | Nakamura .......... H01L 21/4857 |
| | | 174/262 |
| 2008/0010819 A1 | 1/2008 | Nakamura et al. |
| 2008/0191324 A1 | 8/2008 | Qiao et al. |
| 2008/0289868 A1 | 11/2008 | Nakamura et al. |
| 2009/0008141 A1 | 1/2009 | Nakamura et al. |
| 2009/0102037 A1 | 4/2009 | Kim |
| 2012/0038064 A1* | 2/2012 | Camacho ................ H01L 24/81 |
| | | 257/E23.141 |
| 2012/0061823 A1 | 3/2012 | Wu et al. |
| 2012/0100671 A1 | 4/2012 | Kim |
| 2012/0146199 A1 | 6/2012 | McMillan et al. |
| 2013/0056703 A1 | 3/2013 | Elian et al. |
| 2013/0234318 A1* | 9/2013 | Lee .......... H01L 24/81 |
| | | 257/737 |
| 2014/0042615 A1 | 2/2014 | Huang |
| 2014/0070396 A1* | 3/2014 | Kyozuka ............. H01L 23/5389 |
| | | 257/698 |
| 2014/0084482 A1 | 3/2014 | Hu et al. |

FOREIGN PATENT DOCUMENTS

| | | |
|---|---|---|
| KR | 1020110048955 A | 5/2011 |
| KR | 10-2012-0041010 A | 4/2012 |
| KR | 1020120031681 A | 4/2012 |
| KR | 10-2012-0108279 A | 10/2012 |

OTHER PUBLICATIONS

Office Action received from the Taiwan Patent Office in Chinese with English translation; dated Feb. 23, 2017; 24 pages.

Notice of Allowance received from the Taiwan Patent Office in Chinese with English translation; dated Aug. 18, 2017; 3 pages.

* cited by examiner

METHOD OF FORMING A MOLDED SUBSTRATE ELECTRONIC PACKAGE AND STRUCTURE

CROSS-REFERENCE TO RELATED APPLICATIONS

This application is a divisional application of U.S. patent application Ser. No. 15/888,033 filed on Feb. 3, 2018 and issued as U.S. Pat. No. 10,910,298 on Feb. 2, 2021, which is a divisional application of U.S. patent application Ser. No. 14/984,064 filed on Dec. 30, 2015 and issued as U.S. Pat. No. 9,922,919 on Mar. 20, 2018, which claims priority from Korean Patent Application No. 10-2015-0038902 filed on Mar. 20, 2015 in the Korean Intellectual Property Office, and all the benefits accruing therefrom under 35 U.S.C. § 119, the contents of which in their entirety are herein incorporated by reference.

BACKGROUND

The present invention relates, in general, to electronics, and more particularly, to semiconductor packages, structures thereof, and methods of forming semiconductor packages.

Electronic devices, such as semiconductor dies are conventionally enclosed in plastic packages that protect the semiconductor die from hostile environments and that enable electrical interconnection between the semiconductor die and a next level of assembly, such as a printed circuit board (PCB) or motherboard. The elements of a typical electronic package include a conductive leadframe or substrate, an integrated circuit or semiconductor die, conductive structures, such as bond wires or solder balls that electrically connect pads on the semiconductor die to individual leads of the leadframe or substrate; and a hard plastic encapsulant material that covers the other components and forms an exterior of the semiconductor package commonly referred to as the package body. Portions of the individual leads can be exposed to electrically connect the package to the next level assembly.

There is a class of semiconductor packages referred to as near chip scale packages (CSP) that include very thin, fine pitch, and small area substrates that approximate the size of the semiconductor chip. Such features can make this type of substrate difficult to manufacture on a consistent basis particularly with ongoing industry demands to support more functionality within smaller packaged devices.

Accordingly, it is desirable to have a structure and method for forming small area substrates and associated electronic packages, which are easier to manufacture and support industry demands for more functionality and smaller devices. It is further desirable for the structure and method to be cost effective and to support alternative conductive interconnect structures.

Figure 1:
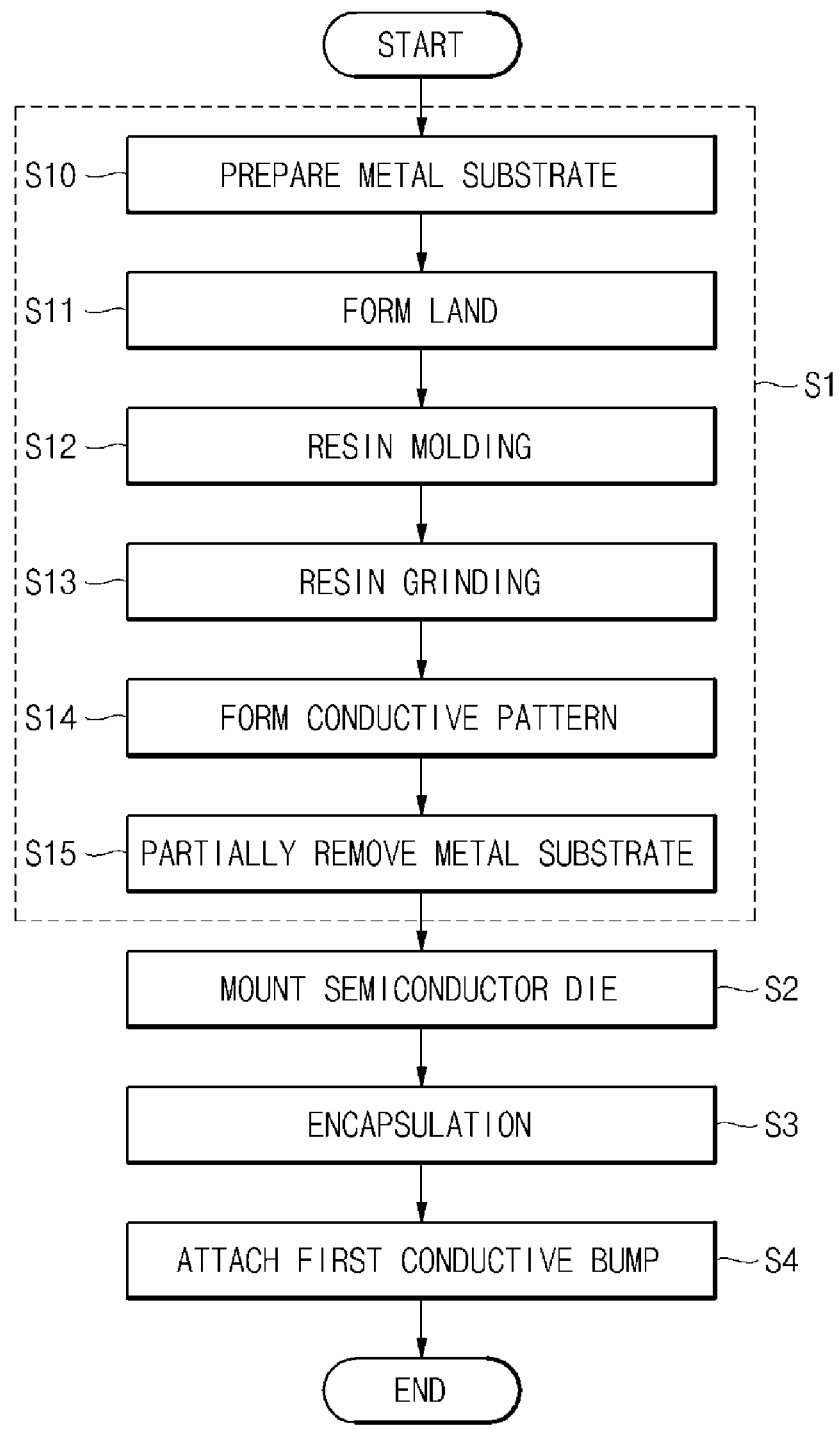
FIG. 1 is a flowchart illustrating a method for manufacturing a semiconductor package in accordance with an embodiment of the present invention.

For simplicity and clarity of illustration, elements in the figures are not necessarily drawn to scale, and the same reference numbers in different figures denote generally the same elements. As used herein, the term "and/or" includes any and all combinations of one or more of the associated listed items. In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms "comprises," "comprising," "includes," and/or "including," when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. Additionally, descriptions and details of well-known steps and elements are omitted for simplicity of the description. It will be appreciated by those skilled in the art that words, during, while, and when as used herein related to circuit operation are not exact terms that mean an action takes place instantly upon an initiating action but that there may be some small but reasonable delay, such as propagation delay, between the reaction that is initiated by the initial action. Additionally, the term while means a certain action at least within some portion of a duration of the initiating action. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. Unless specified otherwise, as used herein the word overlapping includes orientations, placements, or relations where the specified elements can at least partly coincide or align in the same or different planes. It is further understood that the embodiments illustrated and described hereinafter suitably may have embodiments and/or may be practiced in the absence of any element that is not specifically disclosed herein.

DETAILED DESCRIPTION OF THE DRAWINGS

The present description includes, among other features, a method for forming an electronic package structure that uses a molded substrate. The molded substrate can be prepared using a conductive substrate having a plurality of lands connected to a surface of the conductive substrate and separated by grooves or spaces. The grooves are filled with a planarized insulating layer that exposes top surfaces of the land and bottom surfaces of the lands to the outside. Conductive patterns are disposed on the top surfaces of the lands, and, in some embodiments, are formed using a deposition process with the lands configured as seed regions. An electronic device is provided electrically connected to the conductive patterns and a package body is provided to encapsulate the electronic device and portions of the molded substrate with the bottom land surfaces exposed. The structure and method provide an electronic package having a thin profile and adaptable to several configurations for attachment to a next level of assembly.

In one embodiment, a method of forming an electronic package comprises providing a molded substrate having a plurality of lands laterally spaced apart from each other and comprising a conductive material, wherein each land has land sidewall surfaces, a land top surface, and a land bottom surface. An insulating material is disposed along sidewall surfaces of each land, wherein the insulating material has a top surface and an opposing bottom surface. A conductive pattern is disposed on at least a portion of the land top surfaces. The method includes electrically coupling an electronic device to the plurality conductive patterns, and forming a package body encapsulating the top surface of the insulating material and the electronic device, wherein the bottom land surfaces are exposed to the outside.

In one embodiment, providing the molded substrate comprises providing a conductive substrate having a top substrate surface and an opposite bottom substrate surface, forming the plurality of lands connected with the conductive substrate and separated by grooves in cross-sectional view, forming the insulating layer disposed within the grooves and extending over the top land surfaces; removing a portion of the insulating layer to expose the top land surfaces, wherein the insulating layer has a top surface adjoining and substantially co-planar with the top lands surfaces and a bottom surface; forming the conductive patterns; and removing a portion of the conductive substrate from the bottom substrate surface inward to expose the insulating layer to the outside and to define bottom land surfaces of the lands.

In another embodiment, providing the molded substrate includes providing a conductive substrate having a top substrate surface and an opposite bottom substrate surface; forming the plurality of lands connected with the conductive substrate and separated by grooves in cross-sectional view; forming the insulating layer disposed within the grooves and extending over the top land surfaces; removing a portion of the conductive substrate from the bottom substrate surface inward to expose the insulating layer to the outside and to define bottom land surfaces of the lands; removing a portion of the insulating layer to expose the top land surfaces, wherein the insulating layer has a top surface adjoining and substantially co-planar with the top lands surfaces and a bottom surface; and forming the conductive patterns.

In a further embodiment, providing the molded substrate includes providing a conductive substrate having a top substrate surface and an opposite bottom substrate surface; forming the plurality of lands connected with the conductive substrate and separated by grooves in cross-sectional view; forming the insulating layer disposed within the grooves and extending over the top land surfaces; removing a portion of the conductive substrate from the bottom substrate surface inward to expose the insulating layer to the outside and to define bottom land surfaces of the lands; removing a portion of the insulating layer to expose the top land surfaces, wherein the insulating layer has a top surface adjoining and substantially co-planar with the top lands surfaces and a bottom surface; and forming the conductive patterns.

In a still further embodiment, a method of forming an electronic package includes providing a conductive substrate having a top substrate surface and an opposite bottom substrate surface; forming lands connected with the conductive substrate and separated by one or more grooves, wherein the lands each of have a top land surface; forming an insulating layer disposed within the one or more grooves, the insulating layer having a top surface and a bottom surface; forming conductive patterns each on and electrically coupled to a top land surface; removing a portion of the conductive substrate from the bottom substrate surface inward to expose the insulating layer to the outside and to define bottom land surfaces of the lands; electrically coupling an electronic device to the conductive patterns; and forming a package body encapsulating the top substrate surface, the top surface of the insulating layer, the electronic device, and at least portions of the electronic device.

In another embodiment, An electronic package structure comprises a substrate comprising a plurality of lands laterally spaced apart from each other and comprising a conductive material, wherein each land has land sidewall surfaces, a land top surface, and a land bottom surface, an insulating material is disposed along sidewall surfaces of each land, wherein the insulating material has a top surface and an opposing bottom surface, and a plurality of conductive patterns, wherein each conductive pattern is disposed on at least a portion of a respective land top surface. An electronic device is electrically coupled to the plurality conductive patterns, and a package body encapsulates the top surface of the insulating material and the electronic device, wherein the bottom land surfaces are exposed to the outside.

Various aspects of the present description can be embodied in different forms and should not be construed as being limited to the example embodiments set forth herein. Rather, these example embodiments of the disclosure are provided to convey various aspects of the disclosure to those of ordinary skill in the art.

FIG. 1 is a flowchart illustrating a method of manufacturing an electronic package, such as a semiconductor package, in accordance with a first embodiment. In one embodiment, the manufacturing method includes preparing a substrate, such as a molded substrate or resin filled substrate, in operation S1, mounting an electronic device, such as a semiconductor die in operation S2, and performing an encapsulation operation, such as a molding operation, in operation S3. In some embodiments, the method may further include attaching a one or more conductive bumps to the electronic package in operation S4. In accordance with the present embodiment, the operational steps of preparing the substrate in operation S1 may include preparing or providing a conductive substrate, such as a metal substrate, in operation S10, forming a land or trace in operation S11, molding a resin or resin layer in operation S12, removing (e.g., grinding) the resin in operation S13, forming a conductive pattern in operation S14, and partially removing the conductive substrate in operation S15.

Figure 2A:
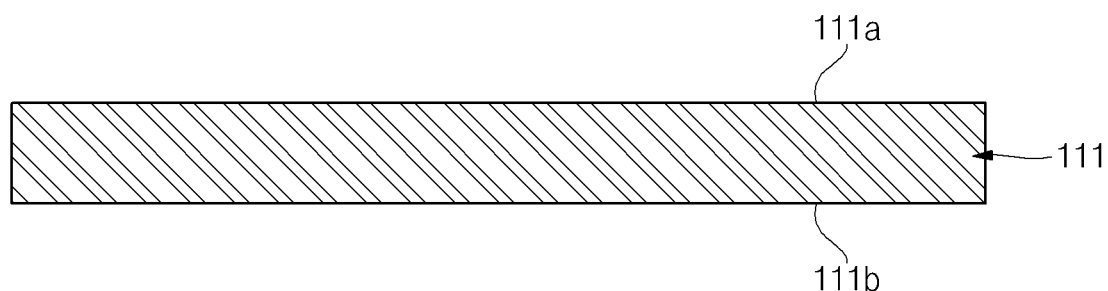
FIGS. 2A to 2I illustrate cross-sectional views of a semiconductor package at various manufacturing steps in accordance with the method of FIG. 1.
Figure 2B:
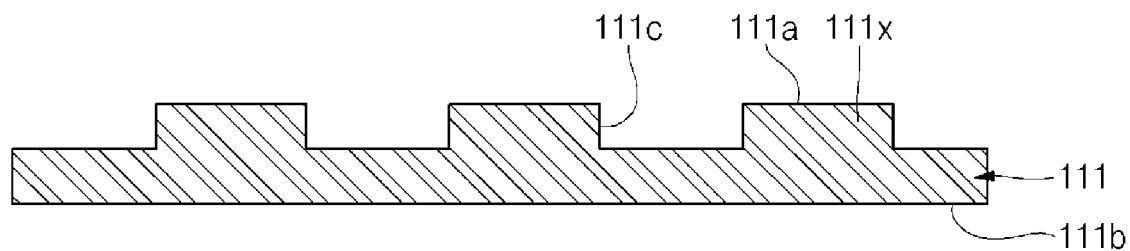
Figure 2C:
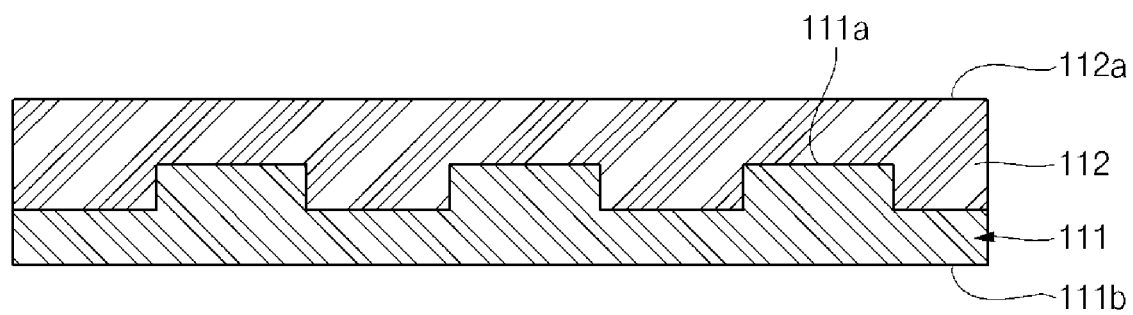
Figure 2D:
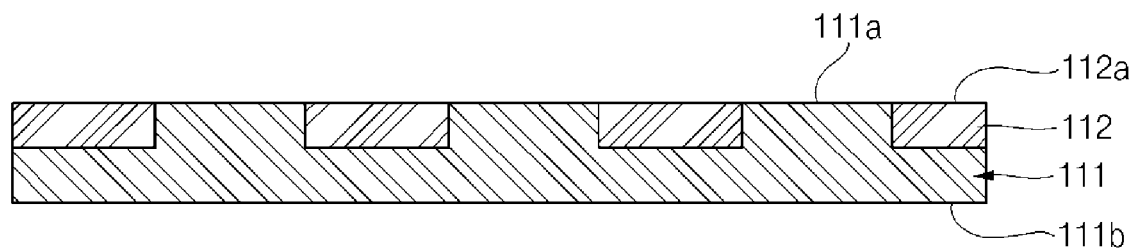
Figure 2E:
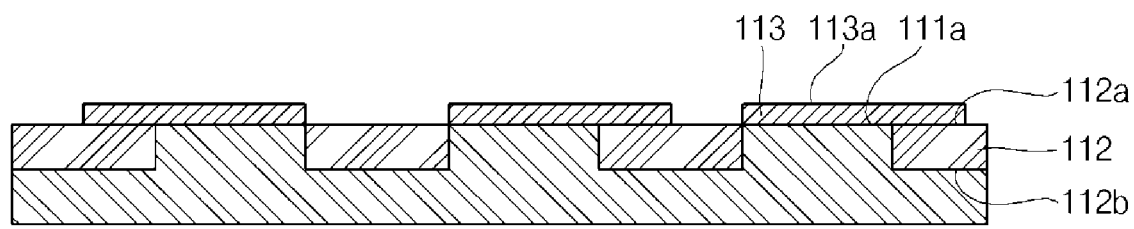
Figure 2F:
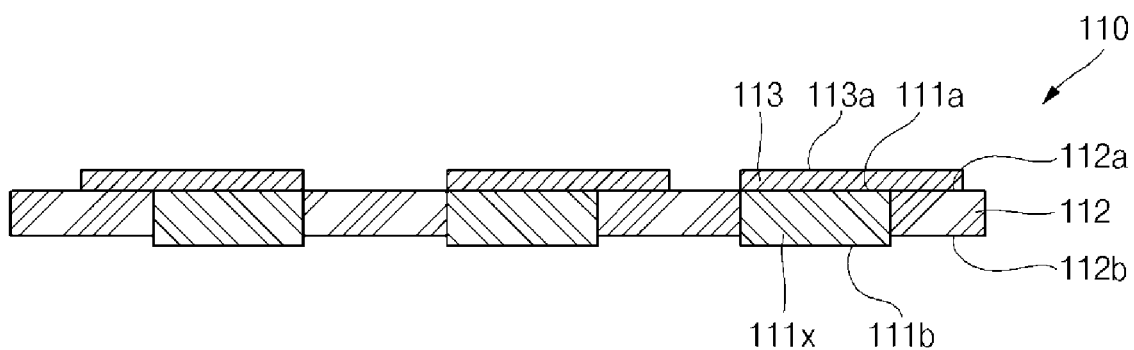
Figure 2G:
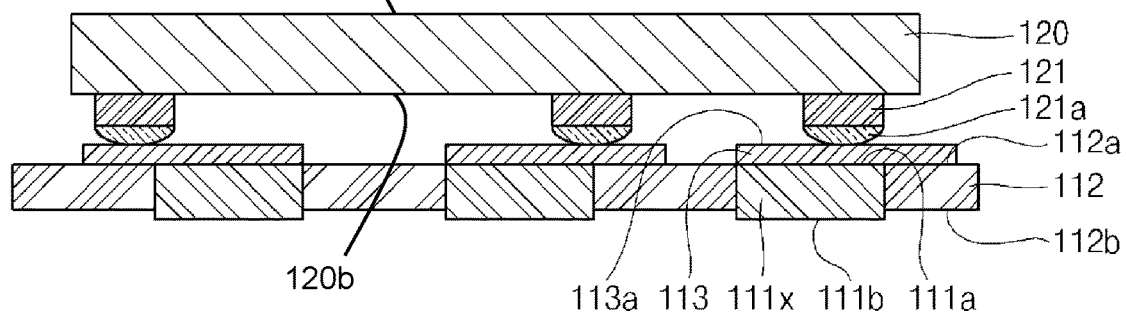
Figure 2H:
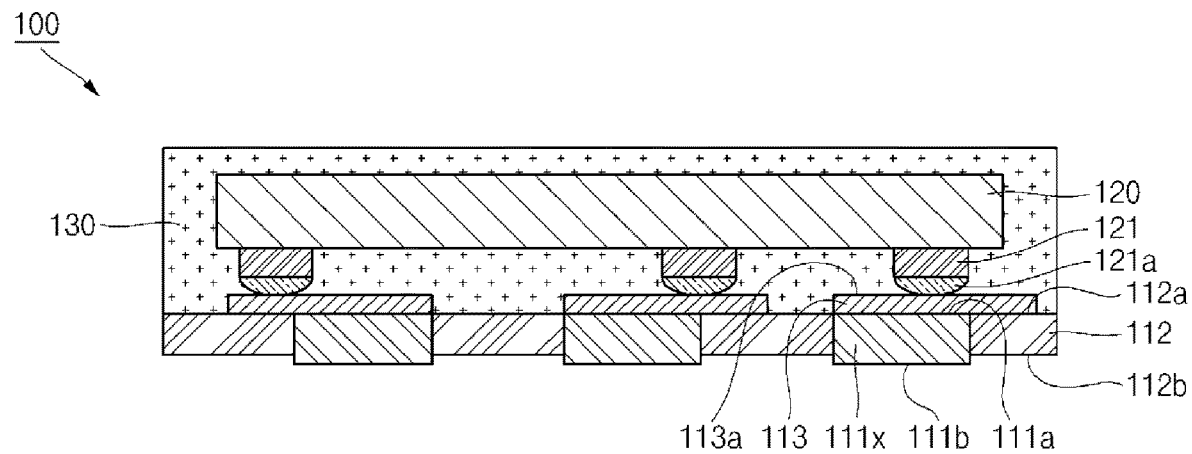
Figure 2I:
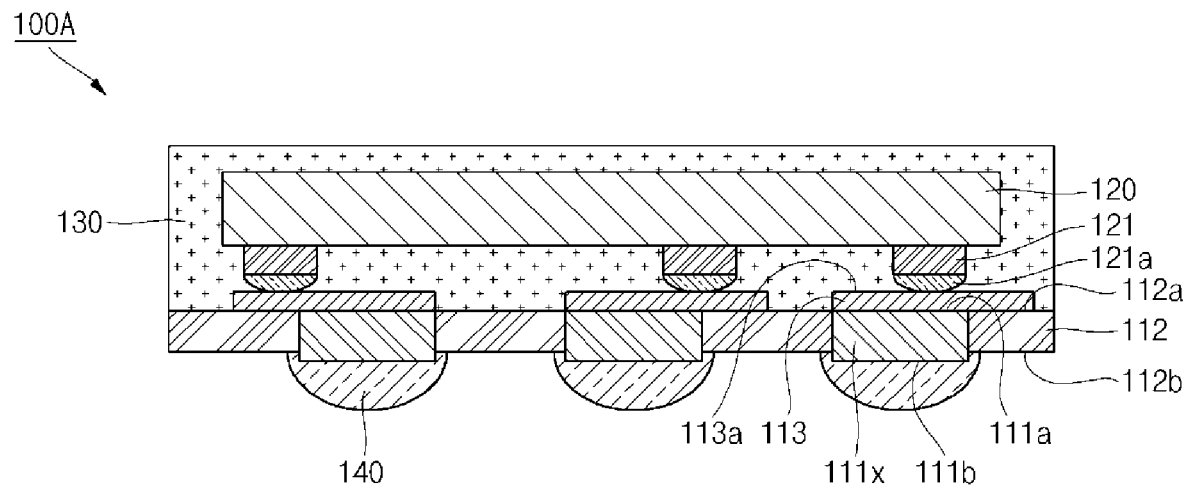

FIGS. 2A to 2H illustrate cross-sectional views of an electronic package 100, such as a semiconductor package 100 at various manufacturing steps in accordance with the method of FIG. 1. More particularly, FIGS. 2A through 2F illustrate semiconductor package 100 in accordance with various operational steps of the molded substrate preparation operation S1 of FIG. 1. FIG. 2H illustrates a cross-sectional view of semiconductor package 100 as a first embodiment, and FIG. 2I illustrates a cross-sectional view of another embodiment referred to as semiconductor package 100A.

Referring now to FIG. 2A first, in accordance with operational step S10, a substrate 111, such as a conductive substrate 111 or metal substrate 111 is provided. Substrate 111 is illustrated in cross-sectional view, and in one embodiment comprises a generally flat plat-like structure having a first surface 111a or top surface 111a and a second surface 111b or bottom surface 111b opposite to top surface 111a. In one embodiment, substrate 111 comprises a metal, such as copper, a copper alloy, or other conductive substrate materials as known to those of ordinary skill in the art. In some embodiments, substrate 111 has a thickness from about 70 microns to about 150 microns.

FIG. 2B illustrates a cross-sectional view of substrate 111 after additional processing in accordance with the land forming operational step S11 of FIG. 1. In one embodiment, a plurality of grooves 111c, grooves 111c, or one more grooves 111c with a predetermined depth are selectively formed within substrate 111 in a direction extending inward from top surface 111a towards bottom surface 111b. In one embodiment, a masking layer (not shown) is disposed on top surface 111a and unmasked portions of substrate 111 are selectively removed extending inward from top surface 111a. In one preferred embodiment, the removal step can comprise a partial etching step, which does not etch all the way through substrate 111. In accordance with the present embodiment, grooves 111c may be formed in an area of substrate 111 other than an area where a plurality of lands 111x or a plurality of conductive pads 111x (described below) are to be formed on substrate 111 in accordance with a desired pattern. It is understood that grooves 111c can be one continuous groove matrix surrounding lands 111x or can be a plurality of individual grooves 111c that are separated by portions of conductive substrate 111. In cross-sectional view of one embodiment, the one continuous groove can have a plurality of groove portions. In accordance with the present embodiments, grooves 111c further define land sidewall surfaces for plurality of lands 111x.

After grooves 111c are formed, an area having top surface 111a protruding from substrate 111 toward an upper part becomes an area where plurality of lands 111x are to be formed after further processing in accordance with the present embodiment. Although grooves 111c are illustrated with generally straight vertical sidewall surfaces, it is understood the other sidewall surface shapes, such as curved shapes or sloped shapes can be used as well.

FIG. 2C illustrates a cross-sectional view of substrate 111 after additional processing in accordance with the molding or resin molding operational step S12 of FIG. 1. In one embodiment, an insulating layer 112, an insulating material 112, an encapsulant 112, molded layer 112, resin layer 112, or resin 112 is formed to fill the plurality of grooves 111c of substrate 111. In one embodiment, resin 112 is formed to cover both grooves 111c and top surface 111a of metal substrate 111. In another embodiment, resin material is disposed only within plurality of grooves 111c leaving top surface 111a exposed after the operational step S12. In one embodiment, resin 112 comprises an electrically insulating material, which may be cured using, for example, a baking process or other post mold curing processes.

FIG. 2D illustrates a cross-sectional view of substrate 111 after additional processing in accordance with a resin removal operational step S13 of FIG. 1. In one embodiment, the resin removal step comprises a grinding process in which a top surface 112a of resin 112 is removed to expose top surface 111a of substrate 111 to the outside. Top surface 111a is exposed through remaining portions of resin 112 disposed within plurality of grooves 111c. In accordance with the present embodiment, top surface 111a of substrate 111 defines top surfaces 111a or top land surfaces 111a of plurality lands 111x or lands 111x for semiconductor package 100. It is understood that small portions of substrate 111 can be removed during the resin removal operational step S13.

FIG. 2E illustrates a cross-sectional view of substrate 111 after further processing in accordance with a conductive pattern formation operational step S14 of FIG. 1. In one embodiment, a plurality of conductive patterns 113 or a plurality of conductive layers 113 are formed respectively on or over top surfaces 111a of lands 111x of substrate 111. In one embodiment, a masking layer (not shown) is formed to cover at least portions of resin 112 in a pre-selected pattern. In one embodiment, conductive patterns 113 are then formed using a deposition process, such as a plating process. In one preferred embodiment, conductive patterns 113 are formed using an electroplating process advantageously using the unmasked portions of lands 111x as seed layers or seed regions. In accordance with the present embodiment, conductive patterns 113 are physically and electrically connected to respective lands 111x within substrate 111. After the deposition process to form conductive patterns 113, the masking layer may be removed. In accordance with the present embodiment, conductive patterns 113 are on or overlap lands 111x and one or more of conductive patterns 113 are further on or further overlap portions of top surface 112a of resin 112 that were also unmasked during the electroplating process. In some embodiments, at least some conductive patterns 113 or portions thereof are wider than lands 111x. In accordance with the present embodiment, conductive patterns 113 and lands 111x are distinct elements and are not unitary elements (i.e., they are not etched or stamped from a single piece of material). In accordance with the present embodiment, operational step S13 advantageously provides conductive patterns 113 as selectively deposited thin films disposed over both lands 111x and portions of top surface 112a of resin 112. Among other things, this provides a fine-pitch implementation for semiconductor package 100 compared to other previous approaches.

FIG. 2F illustrates a cross-sectional view of substrate 111 after additional processing in accordance with a partial substrate removal operational step S15 of FIG. 1. In one embodiment, a portion of substrate 111 is removed from bottom surface 111b inward to electrically isolate lands 111x. In some embodiments, a first predetermined portion of substrate 111 is globally removed or non-selectively removed (i.e., without using a masking layer) from bottom surface 111b, but the global removal step can be terminated before reaching resin 112. By way of example, grinding and/or etching processes can be used for removing the first predetermined portion of substrate 111. Next, a masking layer (not shown) can be formed over the partially etched bottom surface of substrate 111, which covers those locations of substrate 111 where lands 111x are to be formed. Next, a second removal or etching step can be used to remove unmasked portions of substrate 111 to expose bottom surface 112b of resin 112 to the outside. The masking layer can then be removed. In this manner, semiconductor package 100 is configured such that bottom surfaces 111b of lands 111x and bottom surface 112b or resin 112 lie in different horizontal planes. In one embodiment, bottom surfaces 111b and 112b are not co-planar such that bottom surface 112b of resin 112 is recessed or stepped inward with respect to bottom surfaces 111b of lands 111x. In some embodiments this feature advantageously facilitates the attachment of semiconductor package 100 to a next level of assembly, such as a printed circuit board. In an alternative embodiment, a single global removal step can be used to expose bottom surface 112b of resin 112 and to form electrically isolated lands 111x. In other embodiments, portions of bottom surfaces 111b of lands 111x are on or overlap onto resin 112 after the second removal step, which can be achieved using, for example, the masking layer.

In accordance with the present embodiment, at this stage of fabrication, a molded substrate 110 or resin filled substrate 110 is provided through or by operation S1, which includes preparing substrate 111 (S10), forming lands 111x (S11), forming a molded layer or resin 112 (S12), removing portions of molded layer 112 (S13), forming conductive patterns 113 (S14), and removing portions of substrate 111 (S15). Molded substrate 110 comprises plurality of electrically isolated lands 111x, which are laterally spaced apart from each other with molded layer 112 disposed in spaces between lands 111x. Conductive patterns 113 are thin film conductive layers disposed on and electrically connected to top surfaces 111a of lands 111x, and in some embodiments, are further disposed on top surface 112a of molded layer 112. In one embodiment, conductive patterns 113 are on or overlap top surfaces 111a and top surface 112a. Further, in this embodiment of molded substrate 110, bottom surfaces 111b of lands 111x and bottom surface 112b of molded layer 112 are not co-planar such that bottom surface 112b is recessed or stepped inward with respect to bottom surfaces 111b. This feature of the present embodiment advantageously facilitates using bottom surfaces 111b as output pads without having to include additional conductive bumps. In one preferred embodiment, top surfaces 111a of lands 111x are substantially co-planar with top surface 112a of molded layer 112.

FIG. 2G illustrates a cross-sectional view of molded substrate 110 after further processing in accordance with the attachment or mounting of an electronic component 120, such as a semiconductor die 120 operation S2 of FIG. 1. In one embodiment, a semiconductor die 120 is mounted to or electrically connected to top surfaces 113a of conductive pattern 113 of molded substrate 110. In one embodiment, semiconductor die 120 may be mounted to conductive pattern 113 using attachment techniques, such as flip chip bonding, temperature compression (TC) bonding, temperature compression non-conductive paste (TCNCP) bonding techniques or other techniques as known to those of ordinary skill the art. In one embodiment, semiconductor die 120 has a first surface 120a, such as a top surface, and a second surface 120b, such as a bottom surface, opposite to first surface 120a. A plurality of conductive bumps 121 is provided on second surface 120b, which is facing conductive pattern 113. In accordance with the present embodiment, semiconductor die 120 is electrically connected to conductive pattern 113 through the plurality of conductive bumps 121. In some embodiments, each conductive bump 121 may further include a solder cap 121a at a distal end part to facilitate attached to conductive pattern 113. In some embodiments, each conductive bump 121 can comprise a conductive pillar, a Kappa pillar, a conductive ball, a solder ball, or a Kappa ball, combinations thereof, or other similar conductive structures as known to those of ordinary skill in the art. Semiconductor die 120 can be an integrated circuit device, a sensor device, a discrete device, optic device, or another electronic device compatible with the configuration of molded substrate 110.

FIG. 2H illustrates a cross-sectional view of molded substrate 110 and semiconductor die 120 after additional processing in accordance with an encapsulation or molding operation S3 of FIG. 1. In one embodiment, a molding process is used to encapsulate the top surface of molded substrate 110 to form an encapsulant 130 or package body 130. In one embodiment, encapsulant 130 covers or encapsulates semiconductor die 120, conductive patterns 113, and top surface 112a of resin 112, which is exposed in the top surface of molded substrate 110. Encapsulant 130 is configured to electrically isolate and physically protect conductive patterns 113, conductive bumps 121, and semiconductor die 120. In other embodiments, an underfill layer or region (not shown) can be provided between semiconductor die 120 and conductive patterns 113.

In summary, in accordance with the present embodiment, the method provides semiconductor package 100, which can be configured, for example, as a routable micro leadframe package with resin filled or molded substrate 110. In relation to semiconductor package 100 formed in such a way, as substrate 111 is half-etched and a lower part is removed after resin 112 is formed, the thickness of molded substrate 110 may be reduced. In one embodiment, thin film conductive patterns 113 can be formed over top surfaces of lands 111x and resin 112 through electroplating using lands 111x of substrate 111 as seed regions, which simplifies the formation of conductive circuit patterns. Additionally, because conductive patterns 113 can be formed through electroplating, a fine-pitch as-formed implementation is possible in comparison to previous processes. Moreover, the recessed feature of bottom surfaces 112b of resin 112 facilitates the use of lands 111x as output pads, which saves on manufacturing costs and reduces the overall thickness of semiconductor package 100.

FIG. 2I illustrates a cross-sectional view of semiconductor package 100A after additional processing in accordance with an optional conductive bump attachment operation S4 of FIG. 1. In one embodiment, conductive bumps 140 can be formed or attached to bottom surfaces 111b of lands 111x. In accordance with the present embodiment, conductive bumps 140 can be configured as output pads for semiconductor package 100A to facilitate the attachment of semiconductor package 100A to a next level of assembly, such as a printed circuit board. By way of example, conductive bumps 140 can comprise conductive pillars, Kappa pillars, conductive balls, solder balls, conductive bumps, Kappa balls, or other similar conductive structures as known to those of ordinary skill in the art.

Figure 3A:
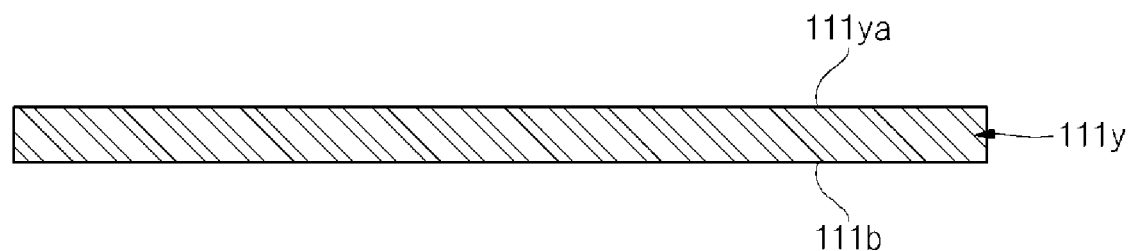
FIGS. 3A and 3B illustrate cross-sectional views for preparing a substrate and forming a land in accordance with another embodiment of the present invention.
Figure 3B:
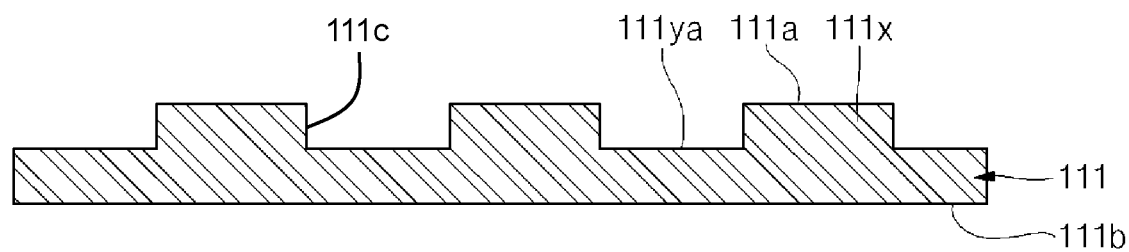

Turning now to FIGS. 3A and 3B, which are cross-sectional views of another conductive substrate, an alternative method for forming lands 111x will be described. In operational step S10, a substrate 111y, such as a conductive substrate 111y or metal substrate 111y is provided, which is illustrated in the cross-sectional view of FIG. 3A. In one embodiment, substrate 111y comprises a generally flat plat-like structure having a first surface 111ya or top surface 111ya and a second surface 111b or bottom surface 111b opposite to top surface 111ya. In one embodiment, substrate 111y can have a reduced thickness compared to substrate 111.

In accordance with the present embodiment, a masking layer (not shown) is disposed over top surface 111ya. In one embodiment, the masking layer includes portions covering parts of top surface 111ya where grooves 111c are to be provided. Next, lands 111x can be formed on top surface 111ya using, for example, an electroplating process that uses the exposed parts of substrate 111 as seed regions. After lands 111x are formed to a desired thickness, the masking layer can be removed. In one embodiment, the masking layer has a thickness that is equal to or greater than the desired thickness of lands 111x. In accordance with the present embodiment, grooves 111c are formed where the masking layer was present, and grooves 111c separate adjacent or adjoining lands 111x. In one embodiment, lands 111x can comprise copper or a copper alloy or other suitable conductive materials. In accordance with one embodiment, to complete semiconductor package 100, operations S12 through S3 and optionally S4 can be used as described previously with FIG. 1.

Figure 4:
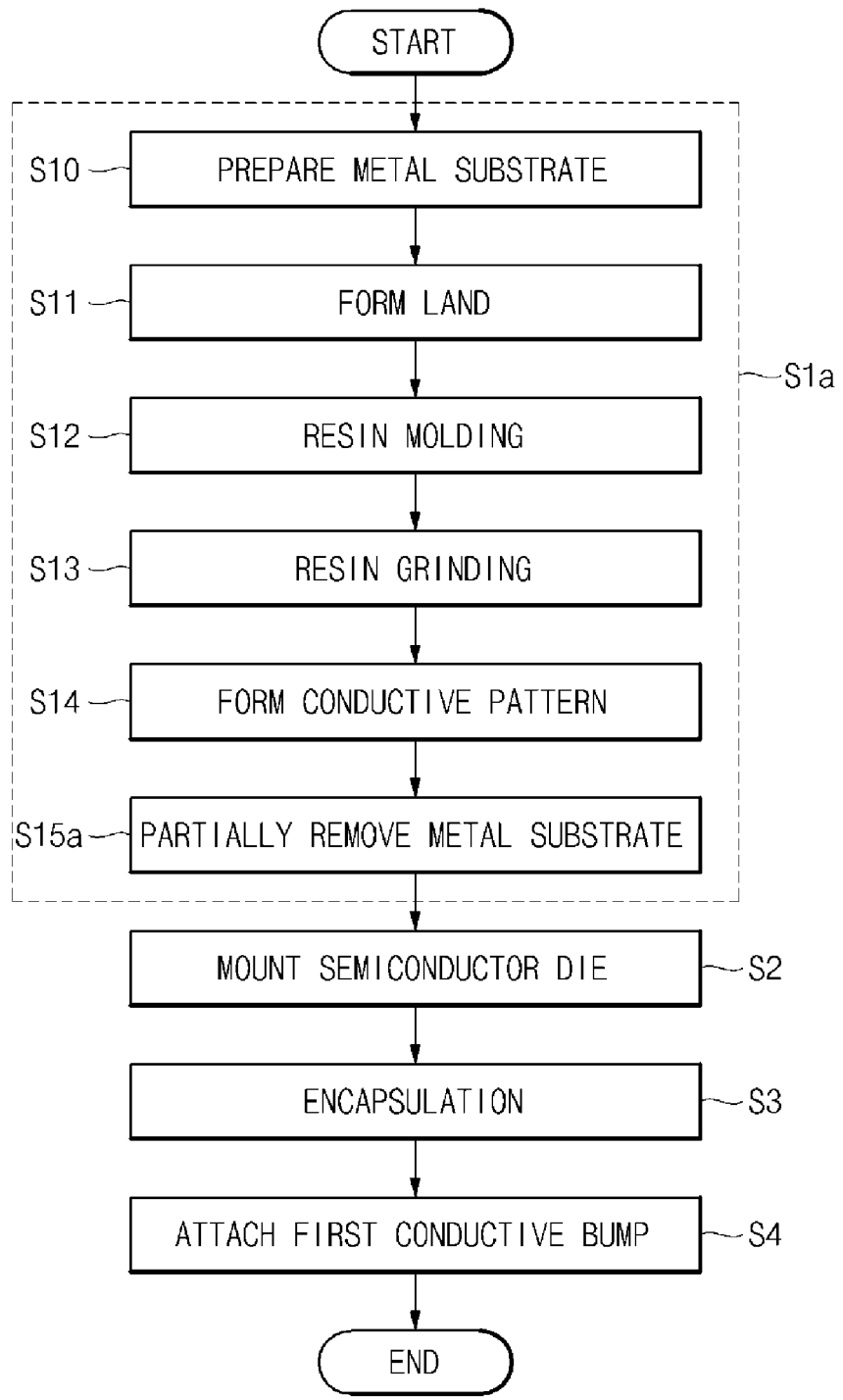
FIG. 4 is a flowchart illustrating a method for manufacturing a semiconductor package in accordance with a further embodiment of the present invention.

FIG. 4 is a flowchart illustrating a method of manufacturing an electronic package, such as a semiconductor package in accordance with another embodiment. In the present embodiment, the method is similar to the embodiment of FIG. 1, and only the difference between the flowchart of FIG. 4 and the flowchart of FIG. 1 will be described hereinafter. Specifically, in the present embodiment, another embodiment of operation S1a for preparing a molded substrate 210 or resin filled substrate 210 is described with an alternative embodiment for operational step S15a, partial removal of the conductive substrate.

Figure 5A:
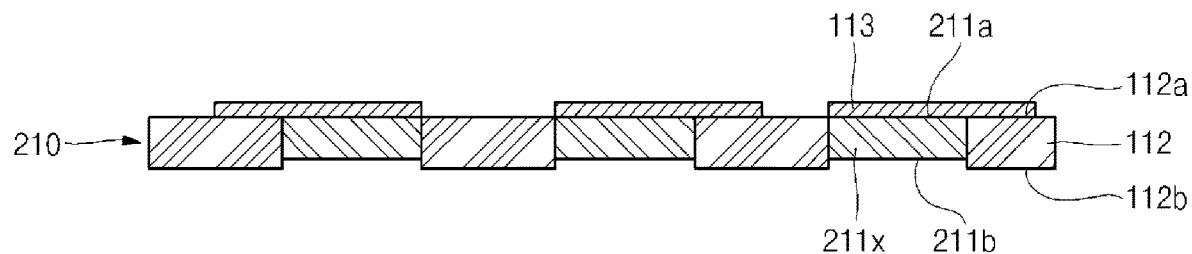
FIGS. 5A to 5D illustrate cross-sectional views of a semiconductor package at various manufacturing steps in accordance with the method of FIG. 4.
Figure 5B:
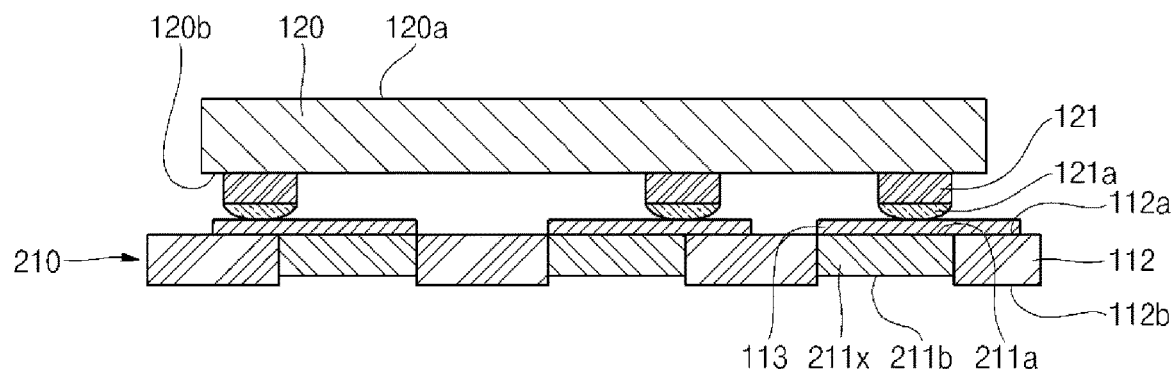
Figure 5C:
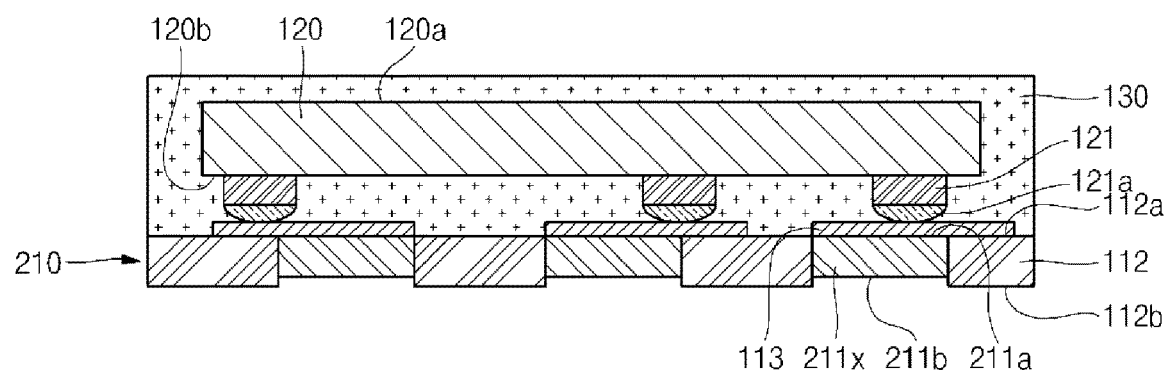
Figure 5D:
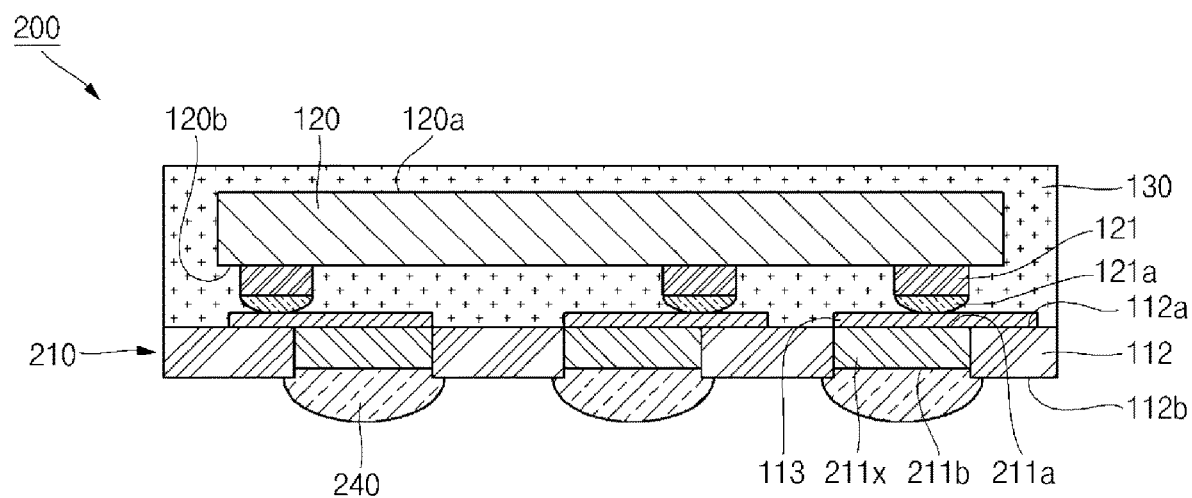

FIGS. 5A to 5D illustrate cross-sectional views of an electronic package 200, such as a semiconductor package 200 at various manufacturing steps in accordance with the method of FIG. 4. More particularly, FIG. 5D illustrates semiconductor package 200 as a completed embodiment. FIG. 5A illustrates a molded substrate 210 or resin filled substrate 210 during the preparation of molded substrate operation S1a. In the operational step S15a of partially removing conductive substrate 211, bottom surface 211b of conductive substrate 211 is removed. In one embodiment, a grinding process can be used to partially remove conductive substrate 211, and, in one embodiment, the grinding step is terminated before bottom surface 112b of resin 112 is exposed. In one embodiment, a second portion of bottom surface 211b of substrate 211 is removed using an etching process or a soft etching process (e.g., an etchant with a reduced etch rate) to expose bottom surface 112b of resin 112. In one embodiment, the front side of conductive substrate 211 can be protected with a masking layer (not shown) during the etching process. In accordance with the present embodiment, the second removal step can be used to recess, step inward, or offset bottom surfaces 211b of lands 211x with respect to bottom surface 112b or resin 112.

In an alternative embodiment, an etching process can be used in place of the grinding process. In one embodiment, when bottom surface 112b of resin 112 is exposed conductive substrate can be further etched to provide the recessed feature of bottom surfaces 211b with respect to bottom surface 112b.

FIG. 5B illustrates a cross-sectional view of molded substrate 210 after additional processing in accordance with the attachment or mounting of an electronic component 120, such as a semiconductor die 120 operation S2 of FIG. 4. In one embodiment, a semiconductor die 120 is mounted to or electrically connected to top surfaces 113a of conductive pattern 113 of molded substrate 210. In one embodiment, semiconductor die 120 may be mounted to conductive pattern 113 using attachment techniques, such as flip chip bonding, temperature compression (TC) bonding, temperature compression non-conductive paste (TCNCP) bonding techniques or other techniques as known to those of ordinary skill the art. In one embodiment, semiconductor die 120 has a first surface 120a, such as a top surface, and a second surface 120b, such as a bottom surface, opposite to first surface 120a. A plurality of conductive bumps 121 is provided on second surface 120b, which is facing conductive layers 113. In accordance with the present embodiment, semiconductor die 120 is electrically connected to conductive pattern 113 through the plurality of conductive bumps 121. In some embodiments, each conductive bump 121 may further include a solder cap 121a at a distal end part to facilitate attached to conductive pattern 113. In some embodiments, each conductive bump 121 can comprise a conductive pillar, a Kappa pillar, a conductive ball, a solder ball, or a Kappa ball, combinations thereof, or other similar conductive structures as known to those of ordinary skill in the art.

FIG. 5C illustrates a cross-sectional view of molded substrate 210 and semiconductor die 120 after further processing in accordance with an encapsulation or molding operation S3 of FIG. 4. In one embodiment, a molding process is used to encapsulate the top surface of molded substrate 210 to form an encapsulant 130 or package body 130 of semiconductor package 200. In one embodiment, encapsulant 130 covers or encapsulates semiconductor die 120, conductive patterns 113, and top surface 112a of resin 112, which is exposed in the top surface of molded substrate 210. Encapsulant 130 is configured to electrically isolate and physically protect conductive patterns 113, conductive bumps 121, and semiconductor die 120. In other embodiments, an underfill layer or region (not shown) can be provided between semiconductor die 120 and conductive patterns 113.

FIG. 5D illustrates a cross-sectional view of semiconductor package 200 after additional processing in accordance with a conductive bump attachment operation S4 of FIG. 4. In one embodiment, conductive bumps 240 can be formed or attached to bottom surfaces 211b of lands 211x. In accordance with the present embodiment, conductive bumps 240 can be configured as output pads for semiconductor package 200 to facilitate the attachment of semiconductor package 200 to a next level of assembly. By way of example, conductive bumps 240 can comprise conductive pillars, Kappa pillars, conductive balls, solder balls, conductive bumps, Kappa balls, or other similar conductive structures as known to those of ordinary skill in the art.

In summary, in accordance with the present embodiment, the method in accordance with FIG. 4 provides semiconductor package 200, which can be configured, for example, as a routable micro leadframe package with resin filled substrate 210. In relation to semiconductor package 200 formed in such a way, thin film conductive patterns 113 can be formed over top surfaces of lands 211x and resin 112 through electroplating using lands 211x of substrate 211 as seed regions, which simplifies the formation of conductive circuit patterns. Additionally, because conductive patterns 113 can be formed through electroplating, a fine-pitch implementation is possible in comparison to previous methods.

Figure 6:
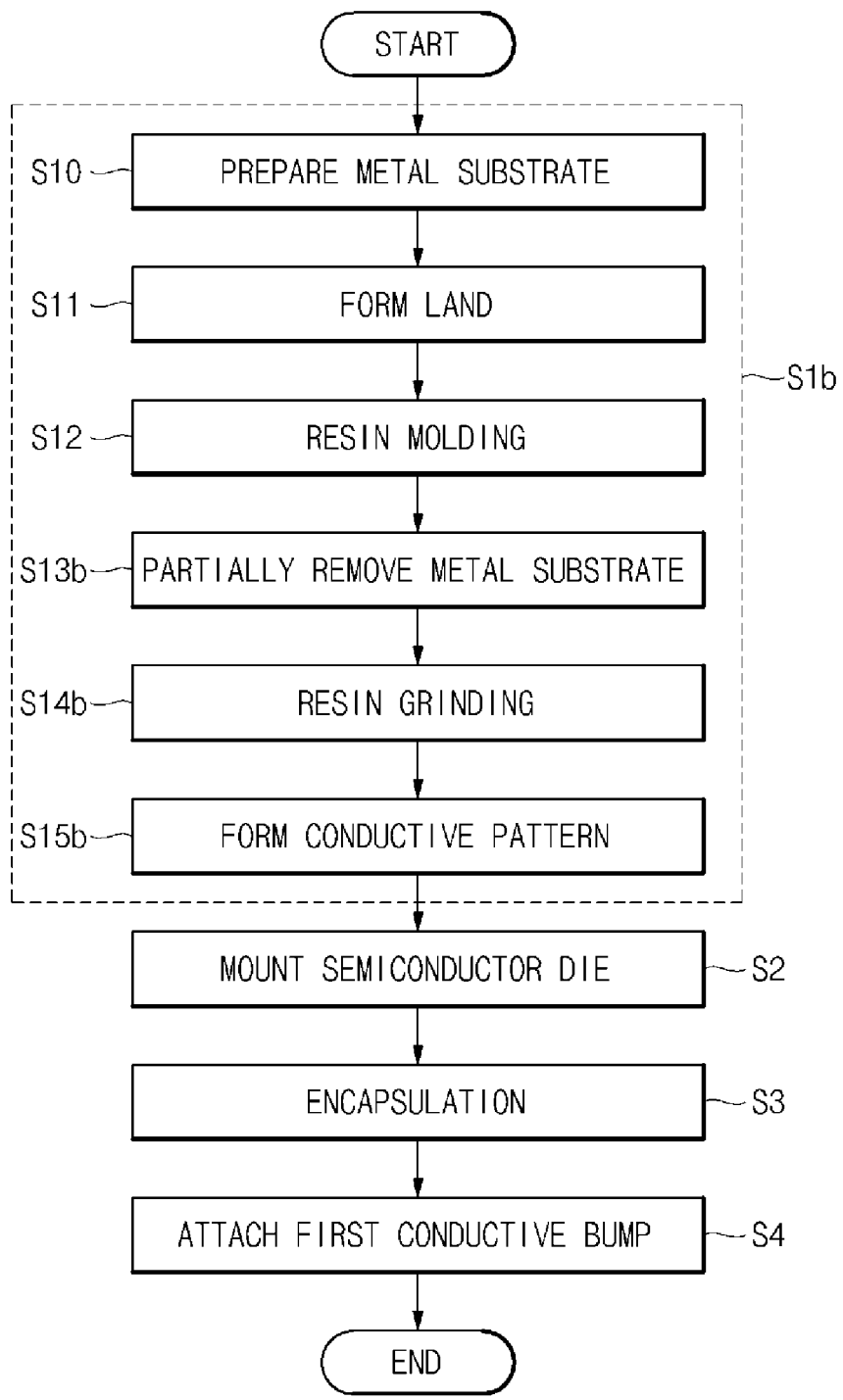
FIG. 6 is a flowchart illustrating a method for manufacturing a semiconductor package in accordance with another embodiment of the present invention.

FIG. 6 is a flowchart illustrating a method of manufacturing an electronic package, such as a semiconductor package, in accordance with a further embodiment. In the present embodiment, the operation S1b of preparing a molded substrate has different operational steps than operations S1 of FIG. 1. More particularly, operational steps S10, S11, and S12 are similar and will not be described hereinafter, but a different sequence of operational steps S13b (partial removal of substrate), S14b (resin removal), and S15b (conductive pattern formation) is used and will be described in conjunction with FIGS. 7A to 7E.

Figure 7A:
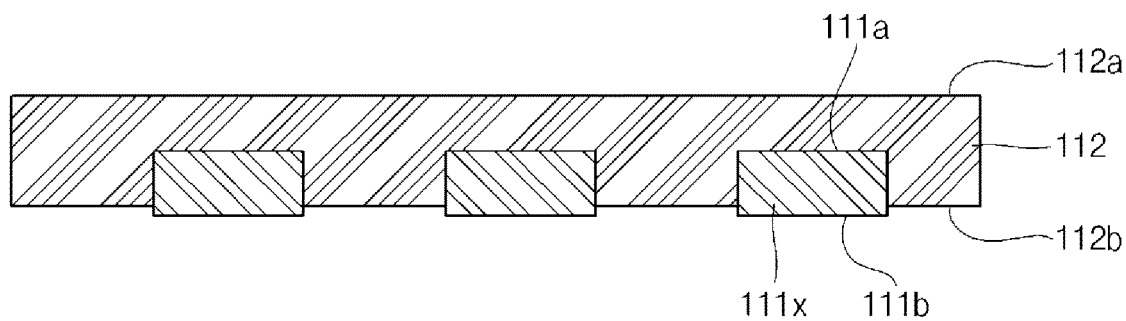
FIGS. 7A to 7F illustrate cross-sectional views of a semiconductor package at various manufacturing steps in accordance with the method of FIG. 6.

FIGS. 7A to 7E illustrate cross-sectional views of electronic package 100, such as semiconductor package 100 at various manufacturing steps in accordance with the method of FIG. 6. FIG. 7A illustrates operational step S13b of partially removing conductive substrate 111 during the operation S1b of preparing molded substrate 110. In the present embodiment, after resin 112 is formed within grooves 111c and over top surface 111a and before resin 112 is removed to expose upper surfaces 111a of lands 111x, a portion of conductive substrate 111 is globally removed or non-selectively removed from bottom surface 111b. In one embodiment, a grinding process can be used for the removal step and the grinding can be terminated before bottom surface 112b of resin 112 is exposed. In an alternative embodiment, an etching process can be used or can be used in combination with grinding. Next, in one embodiment, a masking layer (not shown) can be formed on bottom surface 111b to cover areas of substrate 111 where lands 111x are to be formed. A second removal or etching step can be used to remove unmasked portions of substrate 111 to expose bottom surface 112b of resin 112 to the outside through the masking layer. The masking layer can then be removed. In accordance with the present embodiment, bottom surfaces 111b of lands 111x and bottom surface 112b of resin 112 lie in different horizontal planes. In one embodiment, bottom surfaces 111b and 112b are not co-planar such that bottom surface 112b of resin 112 is recessed or stepped inward with respect to bottom surfaces 111b. In some embodiments this feature advantageously facilitates the attachment of semiconductor package 100 to a next level of assembly, such as a printed circuit board. In an alternative embodiment, an etching process can be used for the first removal step to remove a first predetermined thickness. The masking layer can be formed as described previously and the second removal step or etching step can be used to form lands 111x.

Figure 7B:
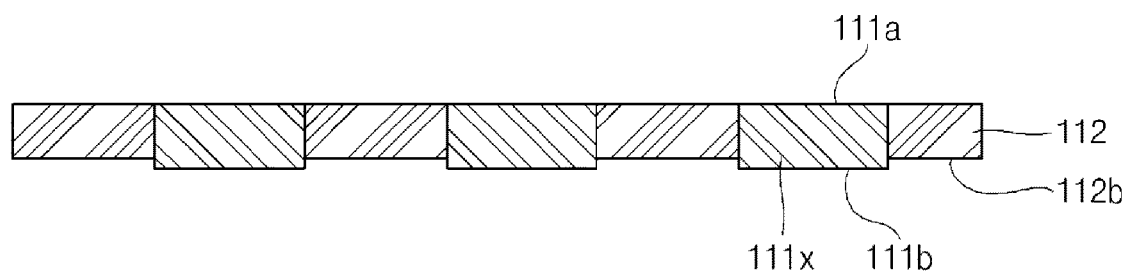

FIG. 7B illustrates a cross-sectional view of molded substrate 110 after further processing in accordance with a removal of resin operational step S14b of FIG. 6. In one embodiment, the removal step comprises grinding top surface 112a of resin 112 to remove a portion of resin 112 and to expose top surfaces 111a of lands 111x of substrate 111 to the outside. In other embodiments, an etching process can be used either singularly or in combination with grinding.

Figure 7C:
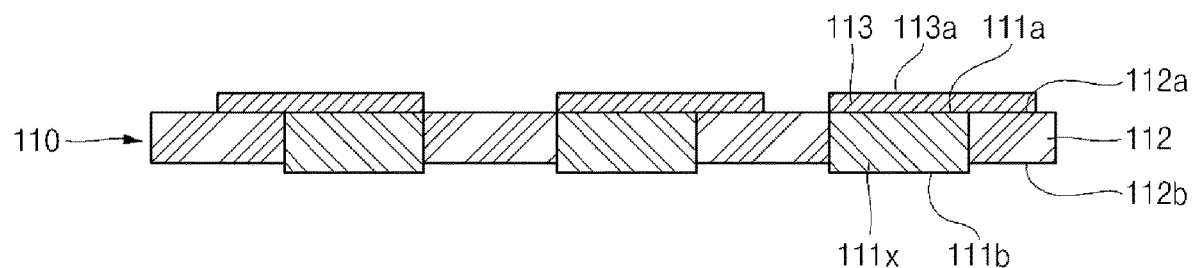

FIG. 7C illustrates a cross-sectional view of molded substrate 110 after additional processing in accordance with a conductive pattern formation operational step S15b of FIG. 6. In one embodiment, plurality of conductive patterns 113 or plurality of conductive layers 113 are formed respectively on or over top surfaces 111a of plurality of lands 111x of substrate 111. In one embodiment, a masking layer (not shown) is formed to cover resin 112 in a pre-selected pattern. In one embodiment, conductive patterns 113 are then formed using a deposition process, such as a plating process. In one preferred embodiment, conductive patterns 113 can be formed using an electroplating process advantageously using the unmasked portions of lands 111x as seed layers or seed regions. In accordance with the present embodiment, conductive patterns 113 are physically and electrically connected to respective lands 111x within substrate 111. After the deposition process to form conductive patterns 113, the masking layer may be removed. In accordance with the present embodiment, conductive patterns 113 are on or overlap lands 111x, and one or more of conductive patterns 113 are further on or further overlap portions of top surface 112a of resin 112. In some embodiments, at least some conductive patterns 113 or portions thereof are wider than lands 111x. In accordance with the present embodiment, conductive patterns 113 and lands 111x are distinct elements are not unitary elements (i.e., they are not etched or stamped from a single piece of material). In accordance with the present embodiment, operational step S15b advantageously provides conductive patterns 113 as selectively deposited thin films disposed over both lands 111x and portions of top surface 112a of resin 112. Among other things, this provides a fine-pitch as-formed implementation for semiconductor package 100 compared to other previous approaches.

Figure 7D:
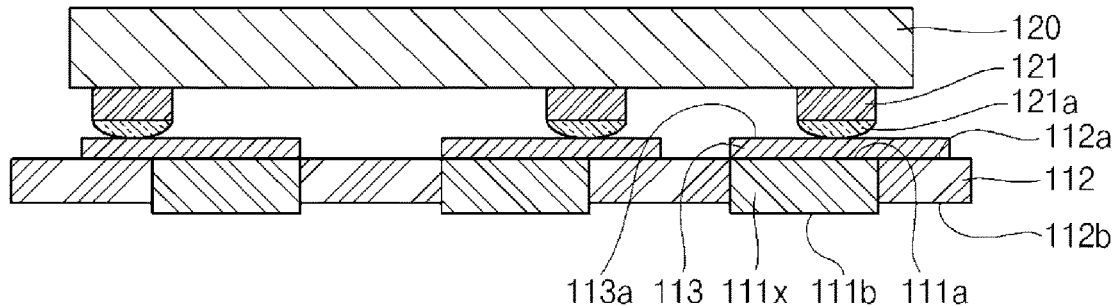

FIG. 7D illustrates a cross-sectional view of molded substrate 110 after further processing in accordance with the attachment or mounting of an electronic component 120, such as a semiconductor die 120 operation S2 of FIG. 6. In one embodiment, operation S2 of FIG. 6 is similar to operation S2 of FIG. 1, and the details of operation S2 will not be repeated here.

Figure 7E:
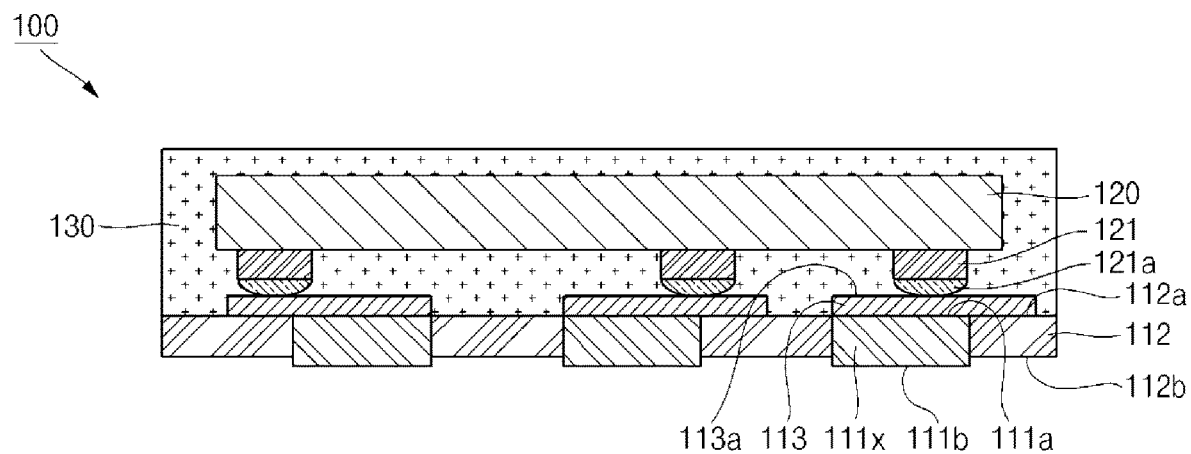

FIG. 7E illustrates a cross-sectional view of a molded substrate 110 and semiconductor die 120 after additional processing in accordance with an encapsulation or molding operation S3 of FIG. 6. In one embodiment, operation S3 of FIG. 6 is similar to operation S3 of FIG. 1, and the details of operation S3 will not be repeated here. After operation S3, semiconductor package 100 is formed and is similar to semiconductor package 100 manufactured through the method illustrated in FIGS. 1 and 2A to 2H.

Figure 7F:
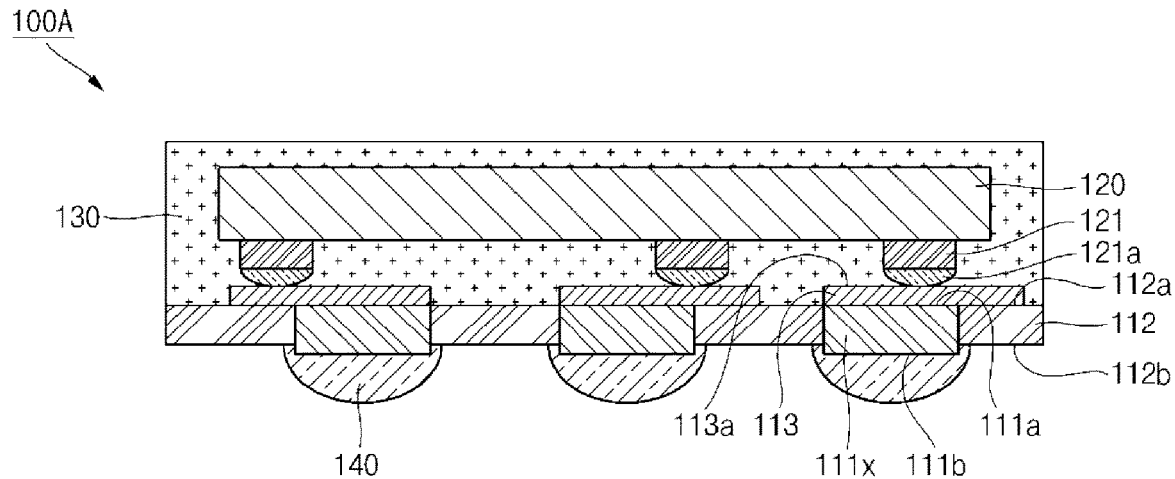

FIG. 7F illustrates a cross-sectional view of semiconductor package 100A after additional processing in accordance with an optional conductive bump attachment operation S4 of FIG. 6. In one embodiment, conductive bumps 140 can be formed or attached to bottom surfaces 111b of lands 111x. In accordance with the present embodiment, conductive bumps 140 can be configured as output pads for semiconductor package 100A to facilitate the attachment of semiconductor package 100A to a next level of assembly. In one embodiment, operation S4 of FIG. 6 is similar to operation S4 of FIG. 1, and the additional details of operation S4 as described in conjunction with FIG. 1 will not be repeated here.

Figure 8:
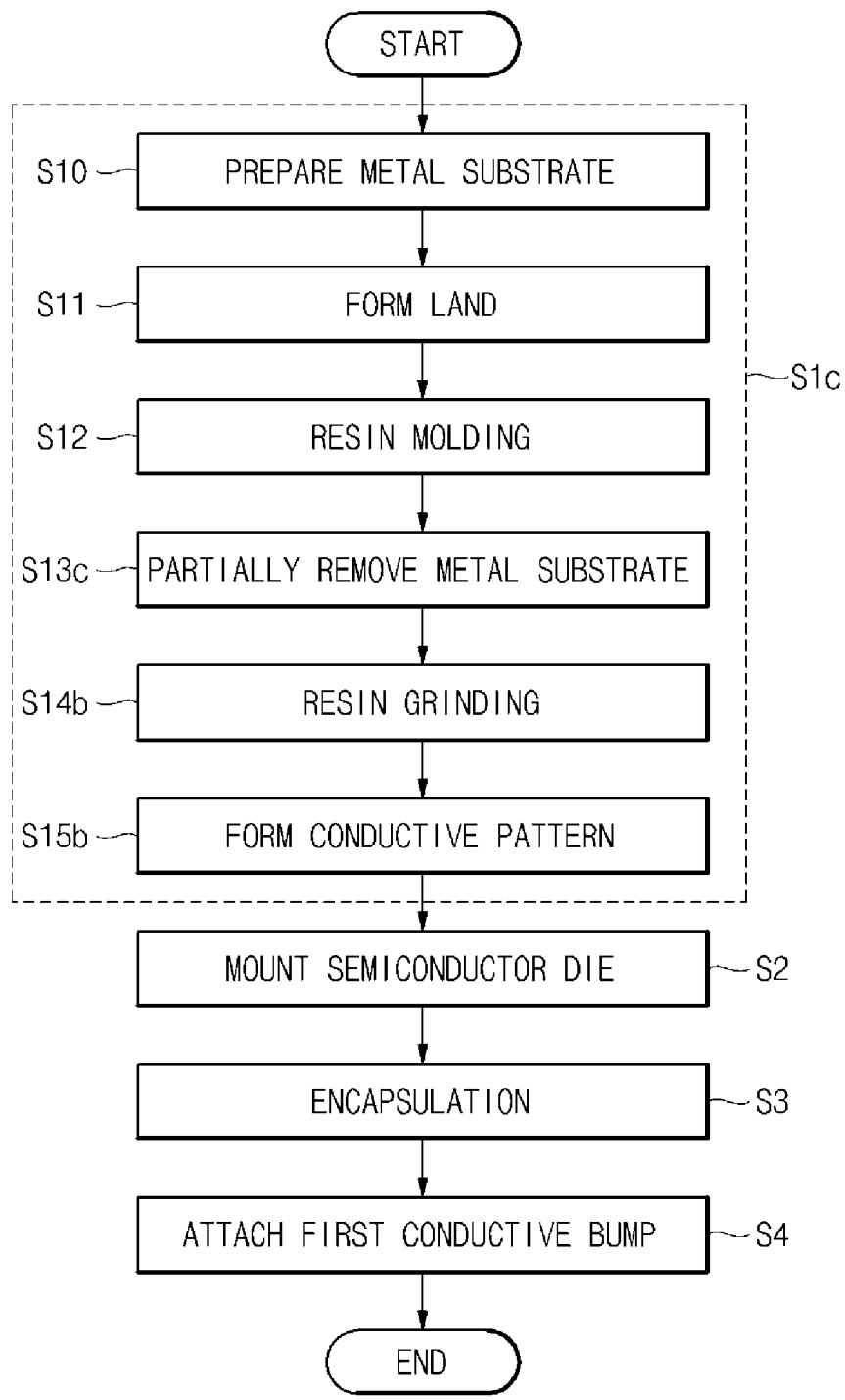
FIG. 8 is a flowchart illustrating a method for manufacturing a semiconductor package in accordance with a further embodiment of the present invention.

FIG. 8 is a flowchart illustrating a method of manufacturing an electronic package, such as a semiconductor package in accordance with another embodiment. In the present embodiment, the operation S1c of preparing a molded substrate has different operational steps than operation S1b of FIG. 6. More particularly, operational steps S10, S11, S12, S14b, and S15b are similar to FIG. 6 and will not be described hereinafter, but a different operational step S13c (partial removal of substrate) is used and will be described in conjunction with FIGS. 9A to 9F. In addition, in one embodiment of FIG. 8, the operations of S2 (Mount semiconductor die), S3 (Encapsulation), and S4 (Attach conductive bumps) can be similar to what has been described previously.

Figure 9A:
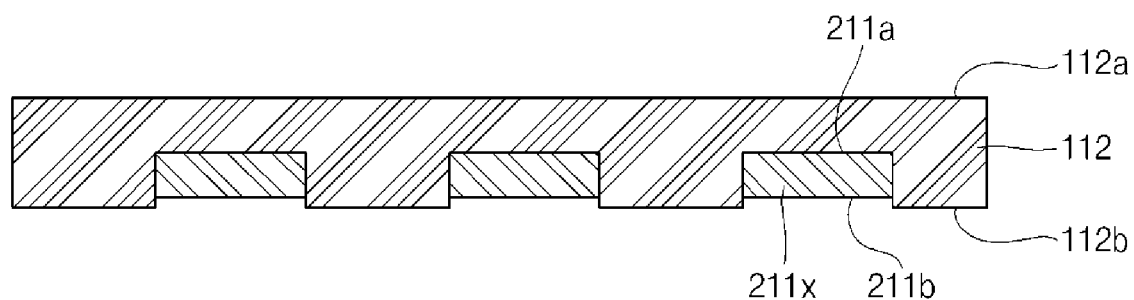
FIGS. 9A to 9F illustrate cross-sectional views of a semiconductor package at various manufacturing steps in accordance with the method of FIG. 8.
Figure 9B:
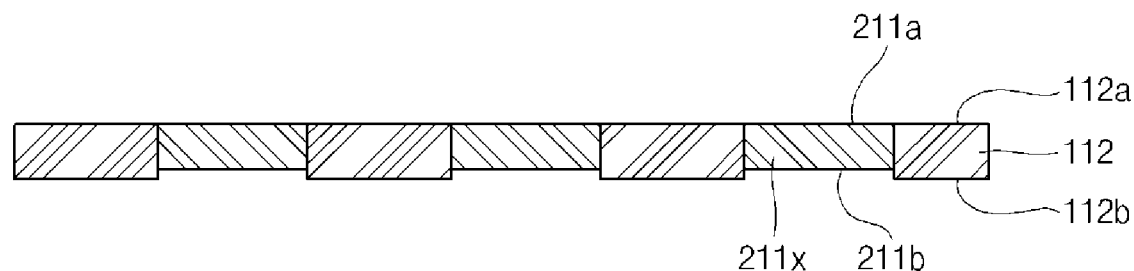
Figure 9C:
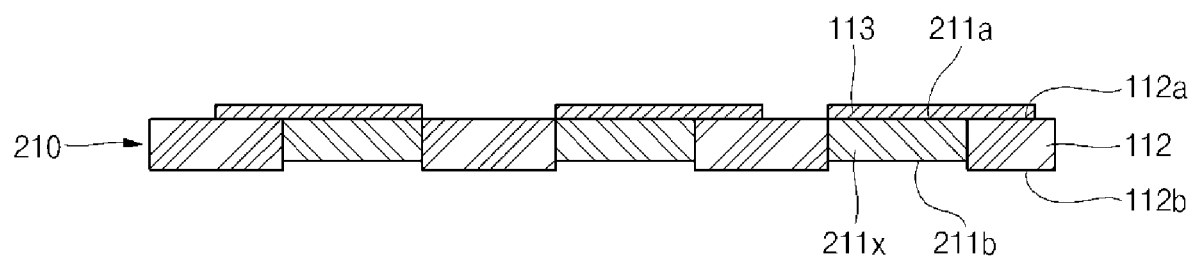
Figure 9D:
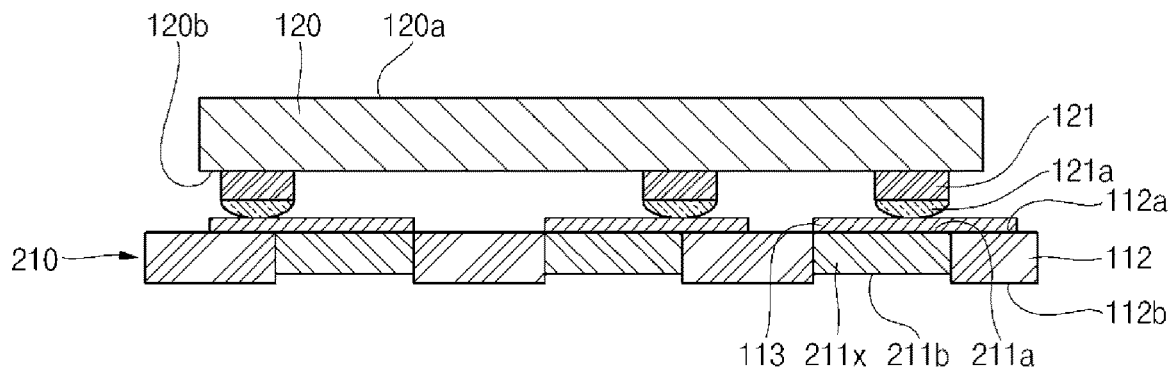
Figure 9E:
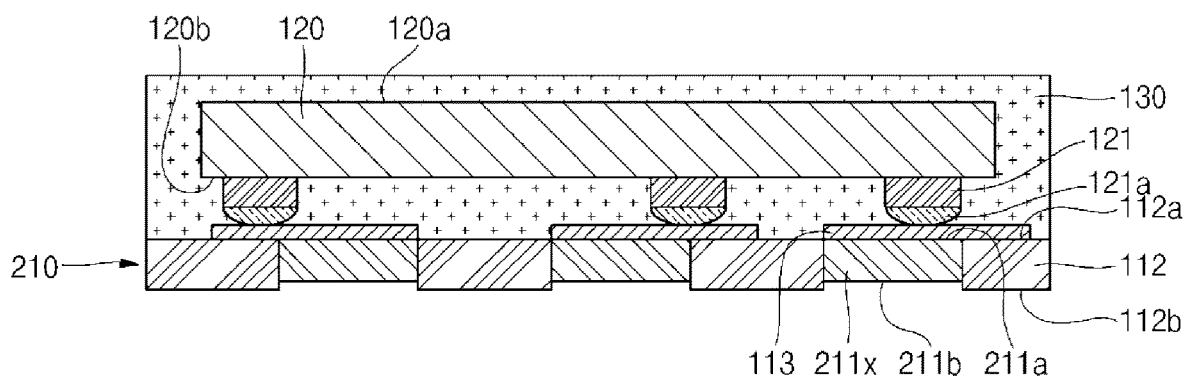
Figure 9F:
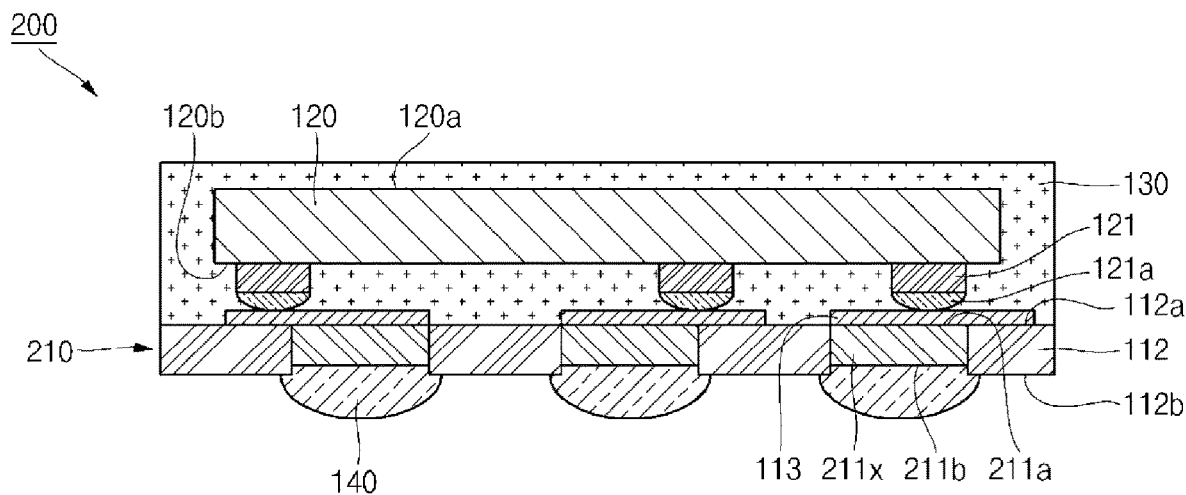

FIGS. 9A to 9F illustrate cross-sectional views of electronic package 200, such as semiconductor package 200 at various manufacturing steps in accordance with the method of FIG. 8. More particularly, FIG. 9F illustrates semiconductor package 200 as a completed embodiment. FIG. 9A illustrates operational step S13c of partially removing conductive substrate 211 during the operation of S1c of preparing molded substrate 210. In the present embodiment, after resin 112 is formed within the grooves and over top surface 211a and before resin 112 is removed to expose upper surfaces 211a of lands 211x, a portion of conductive substrate 211 is globally removed or non-selectively removed from bottom surface 211b. In one embodiment, a grinding process can be used and the grinding can be terminated before bottom surface 112b of resin 112 is exposed. In an alternative embodiment, an etching process can be used for the first removal step, or can be used in combination with grinding. Next, in one embodiment, a second removal step can be used to remove another portion of conductive substrate 211 to expose bottom surface 112b of resin 112. In one embodiment, an etching process or a soft etching process (e.g., an etchant with a reduced etch rate) can be used to expose bottom surface 112b of resin 112. In one embodiment, the second removal step can be used to recess, offset inward, or step inward bottom surfaces 211b of lands 211x with respect to bottom surface 112b or resin 112. In one embodiment, bottom surface 112b and bottom surfaces 211b are not coplanar. In another embodiment, one etching step can be used to remove portions of conductive substrate 211 to expose bottom surface 112b of resin 112 and to further recess bottom surfaces 211b of lands 211x with respect to bottom surface 112b.

FIG. 9B illustrates a cross-sectional view of molded substrate 210 after further processing in accordance with a removal of resin operational step S14b of FIG. 8. In one embodiment, the removal step comprises grinding top surface 112a of resin 112 to remove a portion of resin 112 and expose to top surfaces 211a of lands 211x of substrate 211 to the outside.

FIG. 9C illustrates a cross-sectional view of molded substrate 210 after additional processing in accordance with a conductive pattern formation operational step S15b of FIG. 8. In one embodiment, plurality of conductive patterns 113 are formed respectively on or over top surfaces 211a of plurality of lands 211x of conductive substrate 211. In one embodiment, a masking layer (not shown) is formed to cover resin 112 in a pre-selected pattern. In one embodiment, conductive patterns 113 are then formed using a deposition process, such as a plating process. In one preferred embodiment, conductive patterns 113 can be formed using an electroplating process advantageously using the unmasked portions of lands 211x as seed layers or seed regions. In accordance with the present embodiment, conductive patterns 113 are physically and electrically connected to respective lands 211x within substrate 211. After the deposition process to form conductive patterns 113, the masking layer may be removed. In accordance with the present embodiment, conductive patterns 113 are on or overlap lands 211x and one more of conductive patterns 113 are further on or further overlap portions of top surface 112a of resin 112. In some embodiments, at least some conductive patterns 113 or portions thereof are wider than lands 111x. In accordance with the present embodiment, conductive patterns 113 and lands 211x are distinct elements and are not unitary elements. In accordance with the present embodiment, operational step S15b advantageously provides conductive patterns 113 as selectively deposited thin films disposed over both lands 211x and portions of top surface 112a of resin 112. Among other things, this provides a fine-pitch implementation for semiconductor package 200 compared to other previous approaches.

FIG. 9D illustrates a cross-sectional view of molded substrate 210 after further processing in accordance with the attachment or mounting of an electronic component 120, such as a semiconductor die 120 operation S2 of FIG. 8. Operation S2 of FIG. 8 is similar to operation S2 of FIGS. 4 and 5B, and the details of operation S2 will not be repeated here.

FIG. 9E illustrates a cross-sectional view of a molded substrate 210 and semiconductor die 120 after additional processing in accordance with an encapsulation or molding operation S3 of FIG. 8. In one embodiment, operation S3 of FIG. 8 is similar to operation S3 of FIGS. 4 and 5C, and the details of operation S3 will not be repeated here.

FIG. 9F illustrates a cross-sectional of semiconductor package 200 after additional processing in accordance with a conductive bump attachment operation S4 of FIG. 8. In one embodiment, conductive bumps 140 can be formed or attached to bottom surfaces 211b of lands 211x. In accordance with the present embodiment, conductive bumps 140 can be configured at output pads for semiconductor package 200 to facilitate the attachment of semiconductor package 200 to a next level of assembly. By way of example, conductive bumps 140 can comprise conductive pillars, Kappa pillars, conductive balls, solder balls, conductive bumps, Kappa balls, or other similar conductive structures as known to those of ordinary skill in the art.

Figure 10:
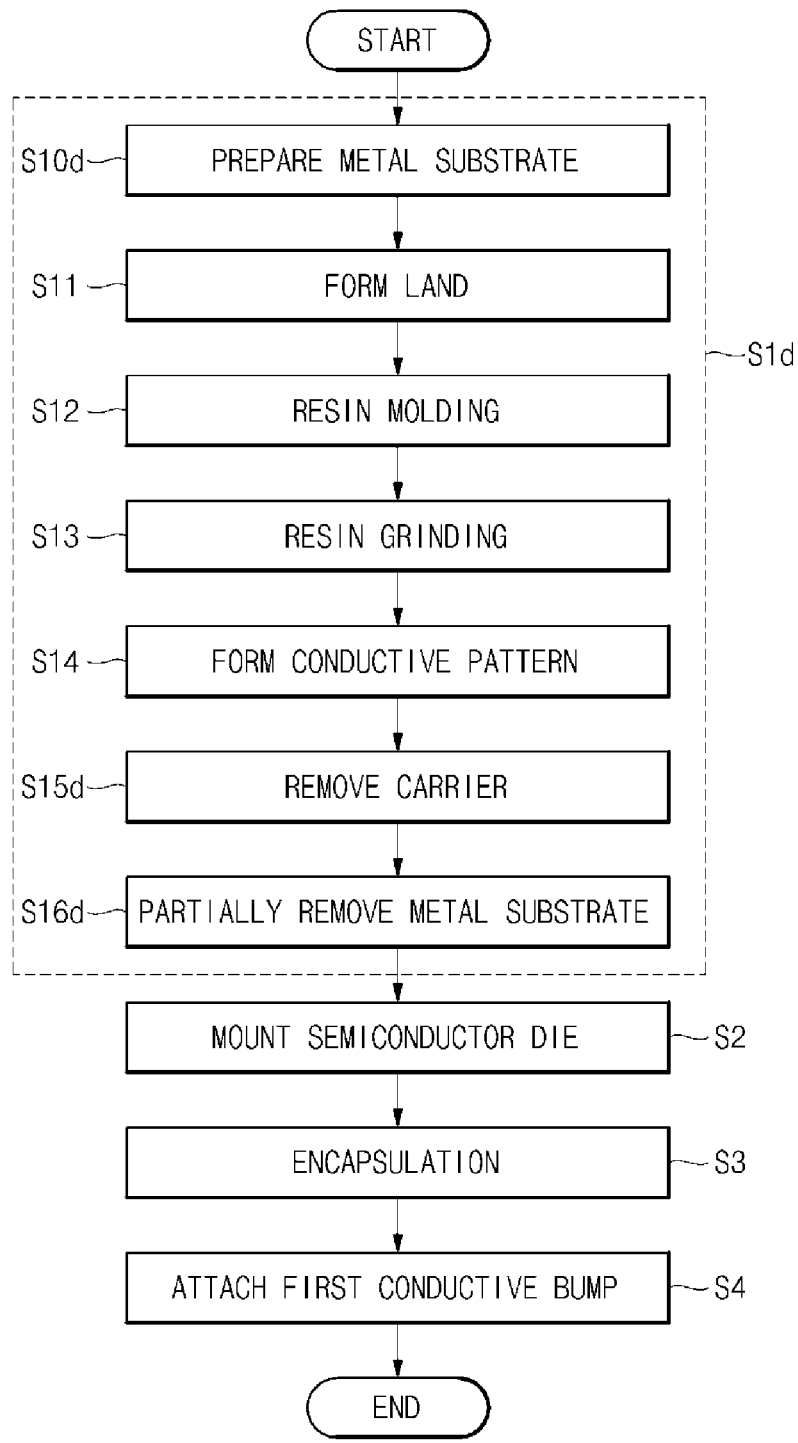
FIG. 10 is a flowchart illustrating a method for manufacturing a semiconductor package in accordance with another embodiment of the present invention.

FIG. 10 is a flowchart illustrating a method of manufacturing an electronic package, such as a semiconductor package in accordance with a further embodiment. Similar to previous embodiments, the method of FIG. 10 comprises an operation S1d of preparing a substrate, such as a molded substrate or resin filled substrate, an operation S2 of mounting an electronic device, such as a semiconductor die, an operation S3 of performing encapsulation, such as performing molding, and an operation S4 of attaching conductive bumps. In accordance with the present embodiment, the operation S1d of preparing a substrate comprises an operational step S10d of preparing a conductive substrate, such as a metal substrate, an operational step S11 of forming one or more lands or traces, an operational step S12 of molding a resin, such as s resin layer, an operational step S13 of removing (i.e., grinding) portions of the resin, an operational step S14 of forming conductive patterns, an operational step S15d of removing a carrier, and an operational step S16d of partially removing the substrate.

Figure 11A:
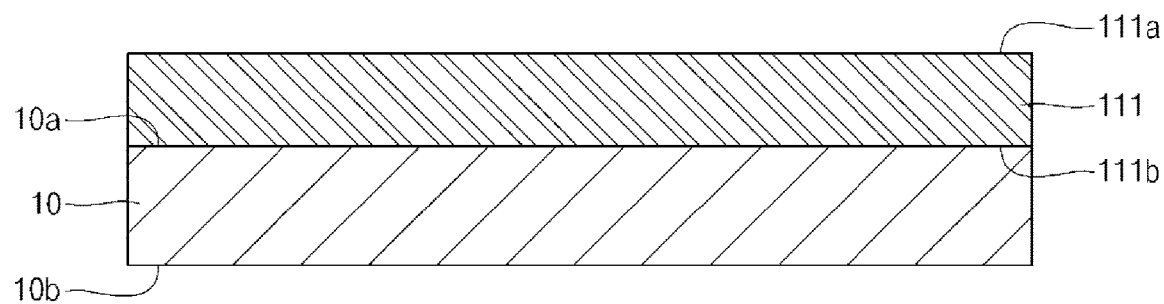
FIGS. 11A to 11J illustrate cross-sectional views of a semiconductor package at various manufacturing steps in accordance with the method of FIG. 10.

Referring now first to FIG. 11A, in accordance with operational step S10d, substrate 111, such as conductive substrate 111 or metal substrate 111. Substrate 111 is illustrated in cross-sectional view, and in one embodiment comprises a generally flat plat-like structure having a first surface 111*a* or top surface 111*a* and a second surface 111*b* or bottom surface 111*b* opposite to top surface 111*a*. In one embodiment, substrate 111 comprises a metal, such as copper, a copper alloy, or other conductive substrate materials as known to those of ordinary skill in the art. In some embodiments, substrate 111 has a thickness from about 70 microns to about 150 microns or more. In accordance with the present embodiment, bottom surface 111*b* of substrate 111 is attached to a top surface 10*a* of a carrier substrate 10 or plate-shaped carrier 10. In one embodiment, substrate 111 can be attached to carrier substrate 10 using, for example, an adhesive material. In another embodiment, substrate 111 can be a deposited conductive layer having thickness of about 75 microns to about 125 microns. In one embodiment, the thickness can be about 100 microns. In one embodiment, carrier substrate 10 can be a semiconductor substrate, such as a silicon substrate, a low grade semiconductor substrate, a glass substrate, a silicon carbide substrate, a sapphire substrate, a quartz substrate, a ceramic substrate, a metal oxide substrate, a metal substrate, or similar substrates as known to those of ordinary skill in the art.

Figure 11B:
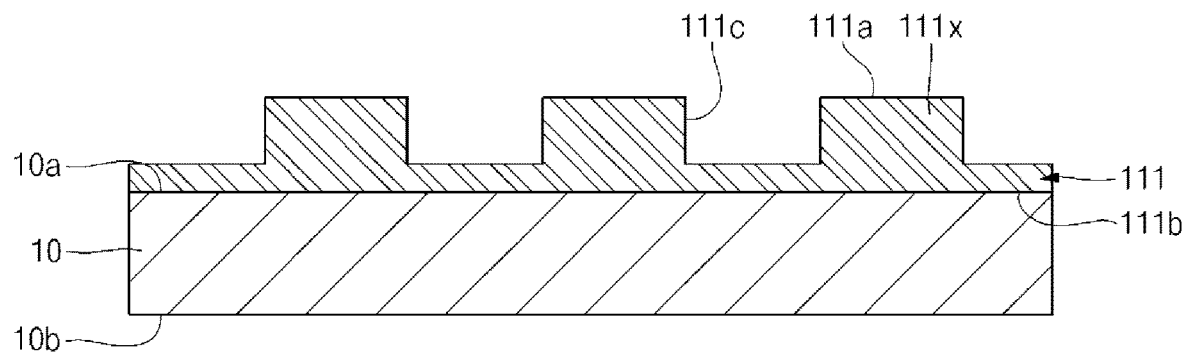

FIG. 11B illustrates a cross-sectional view of substrate 111 and carrier substrate 10 after further processing in accordance with the land forming operational step S11 of FIG. 10. In one embodiment, a plurality of grooves 111*c* with a predetermined depth are selectively formed within substrate 111 in a direction extending inward from top surface 111*a* towards bottom surface 111*b*. In accordance with the present embodiment, grooves 111*c* do not extend all the way through substrate 111. Operational step S11 of FIGS. 10 and 11B is similar to operational step S11 described with FIGS. 1 and 2B, and the details will not be repeated here.

Figure 11C:
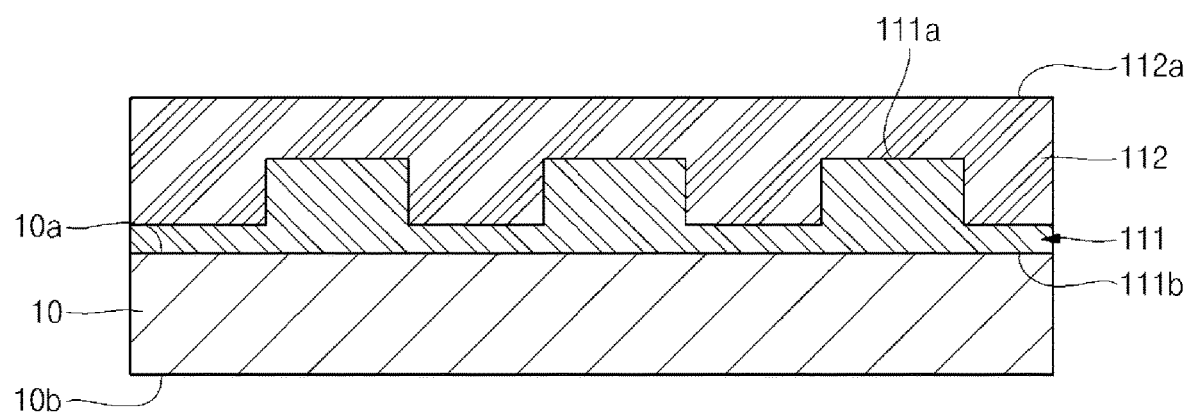

FIG. 11C illustrates a cross-sectional view of substrate 111 and carrier substrate 10 after additional processing in accordance with the molding or resin molding operational step S12 of FIG. 10. In one embodiment, an insulating layer 112, an insulating material 112, an encapsulant 112, molded layer 112, resin layer 112, or resin 112 is formed to fill the plurality of grooves 111*c* of substrate 111. Operational step S12 of FIGS. 10 and 11C is similar to operational step S12 of FIGS. 1 and 2C, and the details will not be repeated here.

Figure 11D:
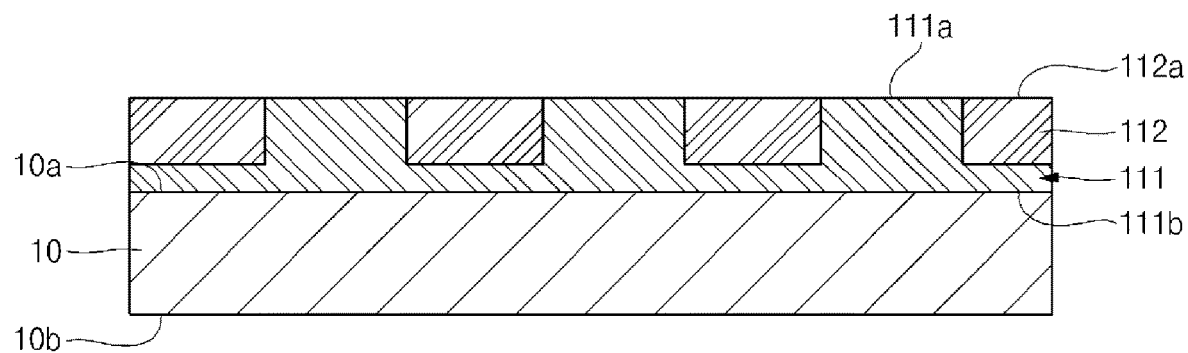

FIG. 11D illustrates a cross-sectional view of substrate 111 and carrier substrate 10 after additional processing in accordance with a resin removal operational step S13 of FIG. 10. In one embodiment, the resin removal step comprises a grinding process in which a top surface 112*a* of resin 112 is removed to expose top surface 111*a* of substrate 111 to the outside. Operational step S13 of FIGS. 10 and 11D is similar to operational step S13 of FIGS. 1 and 2D, and the details will not be repeated here.

Figure 11E:
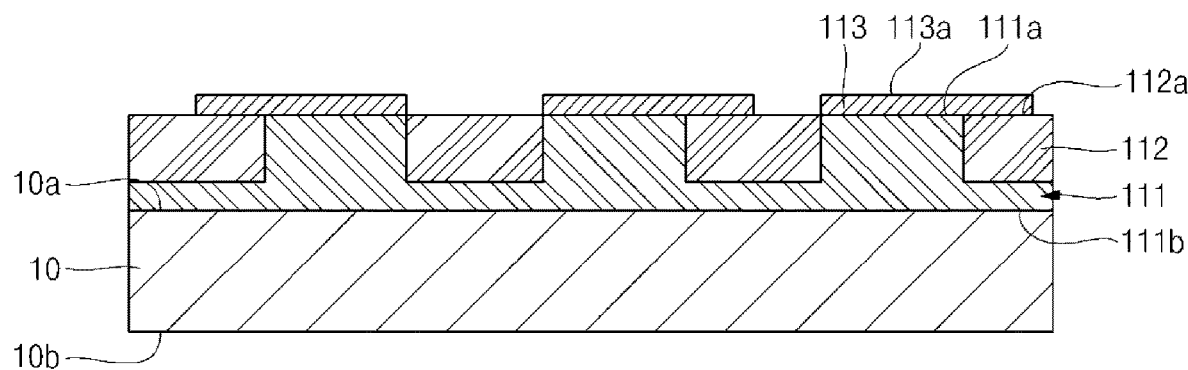

FIG. 11E illustrates a cross-sectional view of substrate 111 and carrier substrate 10 after further processing in accordance with a conductive pattern formation operational step S14 of FIG. 10. In one embodiment, plurality of conductive patterns 113 or plurality of conductive layers 113 are formed respectively on or over top surfaces 111*a* of plurality of lands 111*x* of substrate 111. Operational step S14 of FIGS. 10 and 11E is similar to operational step S14 of FIGS. 1 and 2E, and the details will not be repeated here.

Figure 11F:
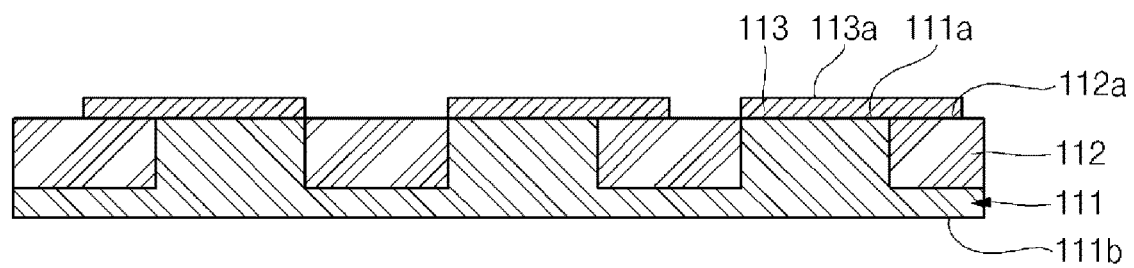

FIG. 11F illustrates a cross-sectional view of substrate 111 after additional processing in accordance with a carrier substrate removal operational step S15*d* of FIG. 10. In one embodiment, carrier substrate 10 is separated from substrate 111 by dissolving the adhesive layer between them. Any residual adhesive can then be removed using a cleaning process. In an alternative embodiment, carrier substrate 10 can be removed using a grinding process and/or an etching process.

Figure 11G:
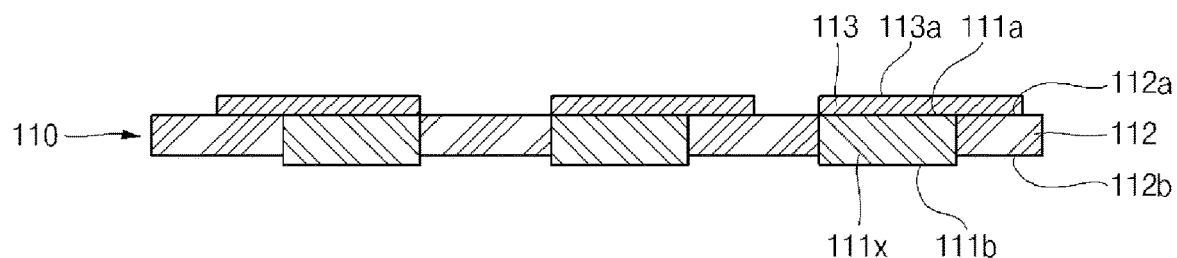

FIG. 11G illustrates a cross-sectional view of substrate 111 after further processing in accordance with a partial substrate removal operational step S16*d* of FIG. 10 to provide molded substrate 110 or resin filled substrate 110. In one embodiment, a portion of bottom surface 111*b* of substrate 111 is removed, lands 111*x* are electrically isolated, and bottom surface 112*b* of resin 112 is exposed to the outside. In one embodiment, a portion of substrate 111 is removed from bottom surface 111*b* inward to provide electrically isolated lands 111*x*. In some embodiments, a first predetermined portion of substrate 111 is globally removed or non-selectively removed (i.e., without using a masking layer) from bottom surface 111*b*, but the global removal step can be terminated before reaching resin 112. By way of example, grinding and/or etching processes can be used for removing the first predetermined portion of substrate 111. Next, a masking layer (not shown) can be formed over the partially etched bottom surface of substrate 111, which covers those locations of substrate 111 where lands 111*x* are to be formed. Next, a second removal or etching step can be used to remove unmasked portions of substrate 111 to expose bottom surface 112*b* of resin 112 to the outside. The masking layer can then be removed. In this manner, semiconductor package 100 is configured such that bottom surfaces 111*b* of lands 111*x* and bottom surface 112*b* or resin 112 lie in different horizontal planes. In one embodiment, bottom surfaces 111*b* and 112*b* are not co-planar such that bottom surface 112*b* is recessed or stepped inward with respect to bottom surfaces 111*b*. In some embodiments this feature advantageously facilitates the attachment of semiconductor package 100 to a next level of assembly, such as a printed circuit board. In an alternative embodiment, a single global removal step can be used to expose bottom surface 112*b* of resin 112 and to form electrically isolated lands 111*x*. In other embodiments, portions of bottom surfaces 111*b* of lands 111*x* are on or overlap onto resin 112 after the second removal step, which can be achieved using, for example, the masking layer.

Figure 11H:
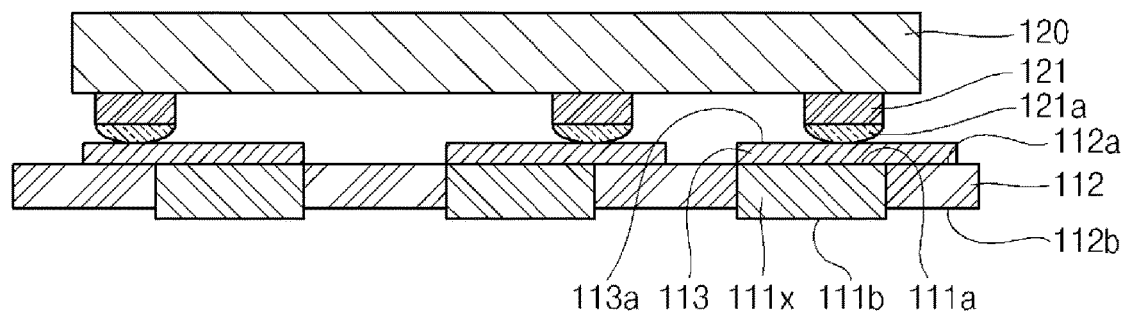

FIG. 11H illustrates a cross-sectional view of molded substrate 110 after additional processing in accordance with the attachment or mounting of electronic component 120, such as semiconductor die 120 operation S2 of FIG. 10. In one embodiment, a semiconductor die 120 is mounted to or electrically connected to top surfaces 113*a* of conductive pattern 113 of molded substrate 110. Operation S2 of FIGS. 10 and 11H is similar to operation S2 of FIGS. 1 and 2G, and the details will not be repeated here.

Figure 11I:
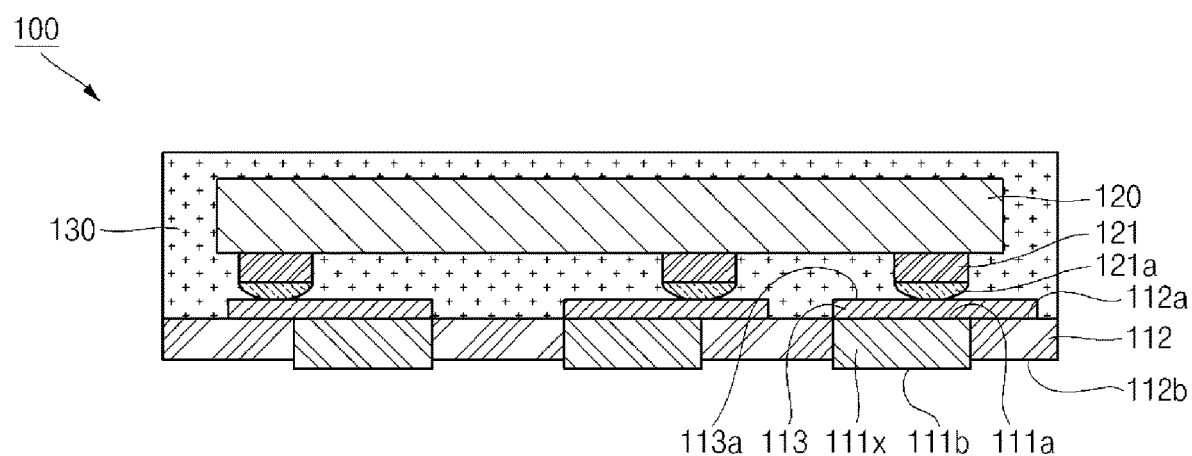

FIG. 11I illustrates a cross-sectional view of molded substrate and semiconductor die 120 after further processing in accordance with an encapsulation or molding operation S3 of FIG. 10. In one embodiment, a molding process is used to encapsulate the top surface of molded substrate 110 to form an encapsulant 130 or package body 130. Operation S3 of FIGS. 10 and 11I is similar to operation S3 of FIGS. 1 and 2H, and the details will not be repeated here.

In one embodiment, semiconductor package 100 manufactured in accordance with FIGS. 10 and 11A to 11I may have the same configuration and form as semiconductor package 100 manufactured in accordance with FIGS. 1 and 2A to 2H.

Figure 11J:
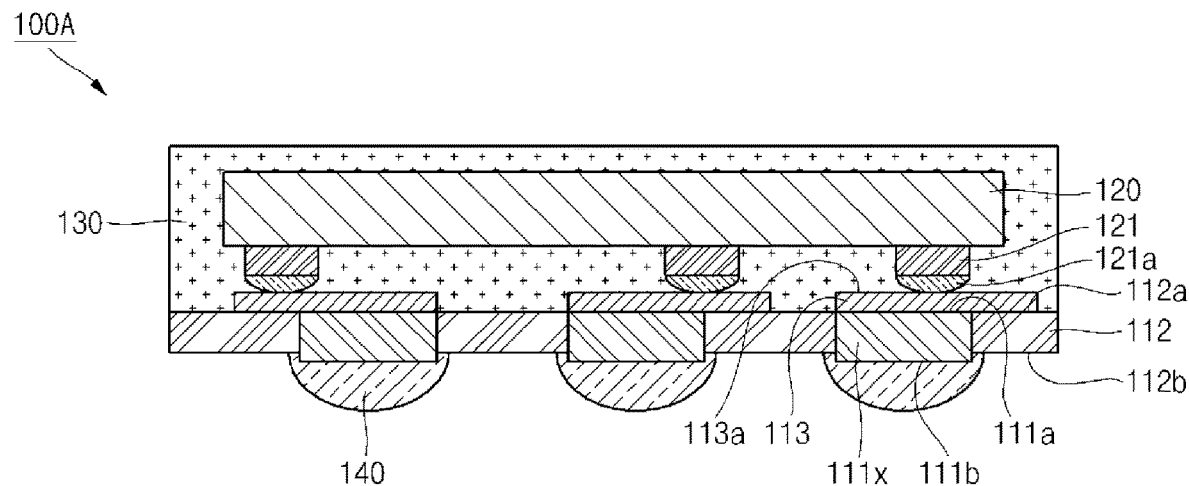

FIG. 11J illustrates a cross-sectional of a semiconductor package 100A after additional processing in accordance with an optional conductive bump attachment operation S4 of FIG. 10. In one embodiment, conductive bumps 140 can be formed or attached to bottom surfaces 111b of lands 111x. Operation S4 of FIGS. 10 and 11J is similar to operation S4 of FIGS. 1 and 2I, and the details will not be repeated here.

In one embodiment, semiconductor package 100A manufactured in accordance with FIGS. 10 and 11A to 11J may have the same configuration and form as semiconductor package 100 manufactured in accordance with FIGS. 1 and 2A to 2I.

Figure 12A:
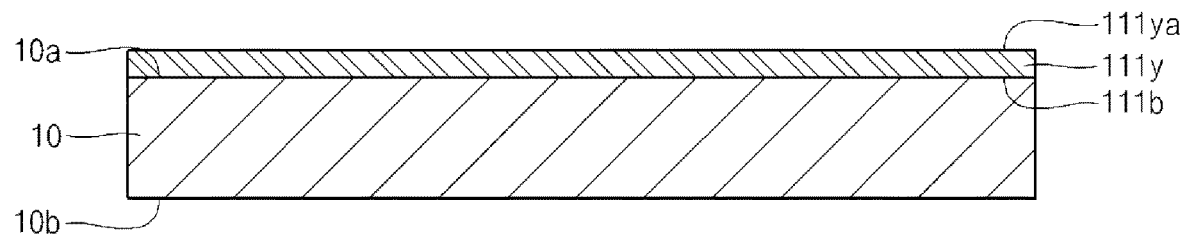
FIGS. 12A and 12B illustrate cross-sectional views for preparing a substrate and forming a land in accordance with another embodiment of the present invention.
Figure 12B:
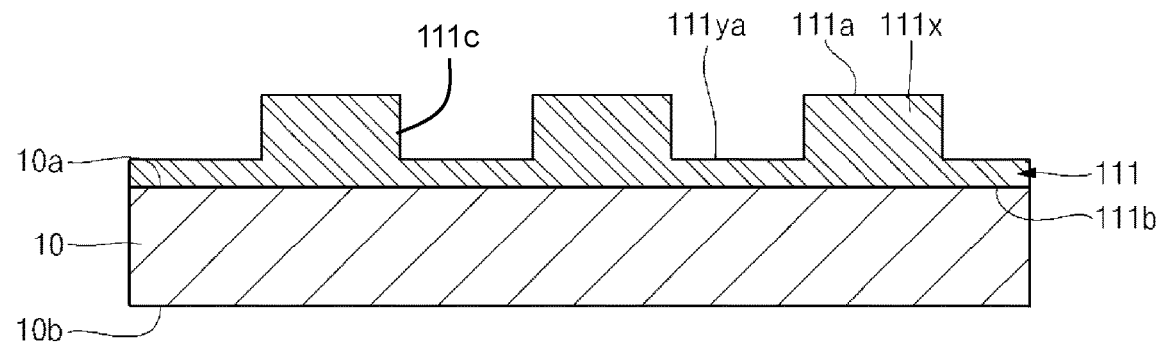

Turning now to FIGS. 12A and 12B, which are cross-sectional views of another conductive substrate, an alternative method for forming lands 111x in operational step S11 of operation S1d will be described. In operational step S10, a substrate 111y, such as a conductive substrate 111y or metal substrate 111y is provided on carrier substrate 10, which is illustrated in FIG. 12A. In one embodiment, substrate 111y comprises a generally flat plat-like structure having a first surface 111ya or top surface 111ya and a second surface or bottom surface 111b opposite to top surface 111ya, which can be adhered to top surface 10a of carrier substrate 10. Substrate 111y and carrier substrate 10 can be similar to substrate 111 and carrier substrate 10 described in FIG. 11A. In one embodiment, substrate 111y can have a reduced thickness compared to substrate 111.

FIG. 12B illustrates a cross-sectional view of substrate 111 and carrier substrate 10 after additional processing in accordance with an alternative method of forming lands 111x in operational step S11. In accordance with the present embodiment, a masking layer (not shown) is disposed over top surface 111ya. In one embodiment, the masking layer includes portions covering parts of top surface 111ya where grooves 111c are to be provided. Next, lands 111x can be formed on top surface 111ya using, for example, an electroplating process that uses the exposed parts of substrate 111 as seed regions. After lands 111x are formed to a desired thickness, the masking layer can be removed. In one embodiment, the masking layer has a thickness that is equal to or greater than the desired thickness of lands 111x. In accordance with the present embodiment, grooves 111c are formed where the masking layer was present, and grooves 111c separate adjacent or adjoining lands 111x. In one embodiment, lands 111x can comprise copper or a copper alloy or other suitable conductive materials. In accordance with one embodiment, to complete semiconductor package 100 or 100A, operations S12-S16d and S2 through S3 and optionally S4 can be used as described previously.

Figure 13:
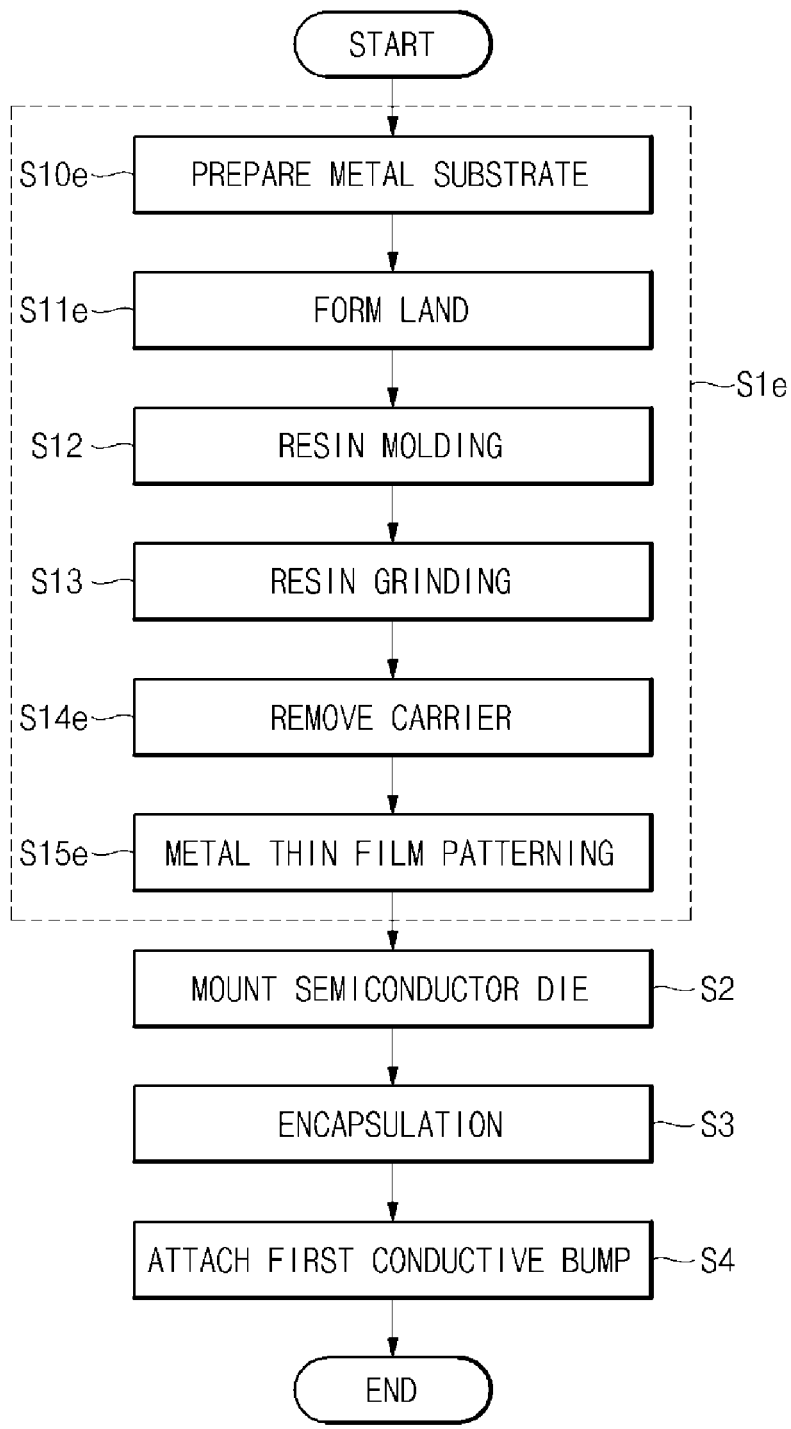
FIG. 13 is a flowchart illustrating a manufacturing method of a semiconductor package according to another embodiment of the present disclosure.

FIG. 13 is a flowchart illustrating a method of manufacturing an electronic package, such as a semiconductor package in accordance with a further embodiment. Similar to previous embodiments, the method of FIG. 13 comprises an operation S1e of preparing a substrate, such as a molded substrate or resin filled substrate, an operation S2 of mounting an electronic device, such as a semiconductor die, an operation S3 of performing encapsulation, such as performing molding, and an operation S4 of attaching conductive bumps. In accordance with the present embodiment, the operation S1e of preparing a substrate comprises an operational step S10e of preparing a conductive substrate, such as a metal substrate, an operational step S11e of forming one or more lands or traces, an operational step S12 of molding a resin, such as s resin layer, an operational step S13 of removing (i.e., grinding) portions of the resin, an operational step S14e of removing a carrier, and an operational step S15e of forming a conductive thin film or pattern.

Figure 14A:
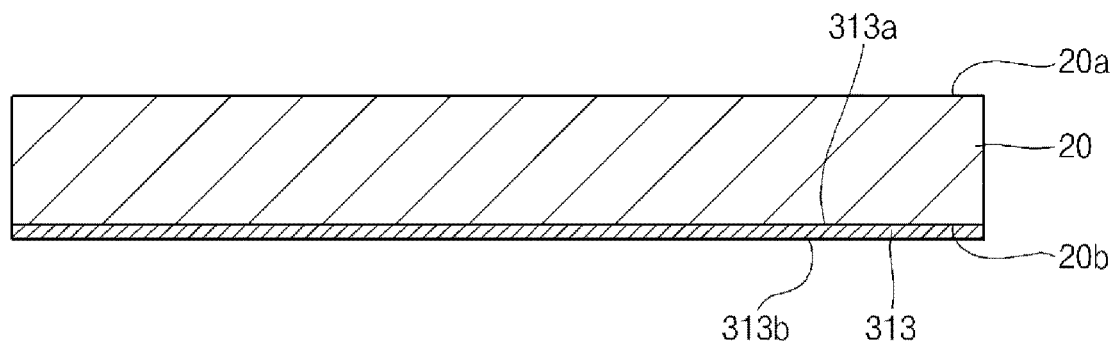
FIGS. 14A to 14I illustrate cross-sectional views of a semiconductor package at various manufacturing steps in accordance with the method of FIG. 13.

Referring now to FIG. 14A first, in accordance with operational step S10e, a conductive film, conductive layer, or metal film 313 having a generally flat top surface 313a and a generally flat opposing bottom surface 313b is disposed on a bottom surface 20b of a carrier substrate 20, such as a plate-shaped carrier 20. In one embodiment, metal film 313 can be deposited layer having thickness in a range from about 20 microns to about 60 microns. In one embodiment, metal film 313 can have a thickness of about 40 microns. In one embodiment, top surface 313a of metal film 313 adheres to bottom surface 20b of carrier substrate 20. Similar to carrier substrate 10, carrier substrate 20 can be a semiconductor substrate, such as a silicon substrate, a low-grade semiconductor substrate, a glass substrate, a silicon carbide substrate, a sapphire substrate, a quartz substrate, a ceramic substrate, a metal oxide substrate, a metal substrate, or similar substrates as known to those of ordinary skill in the art.

Figure 14B:
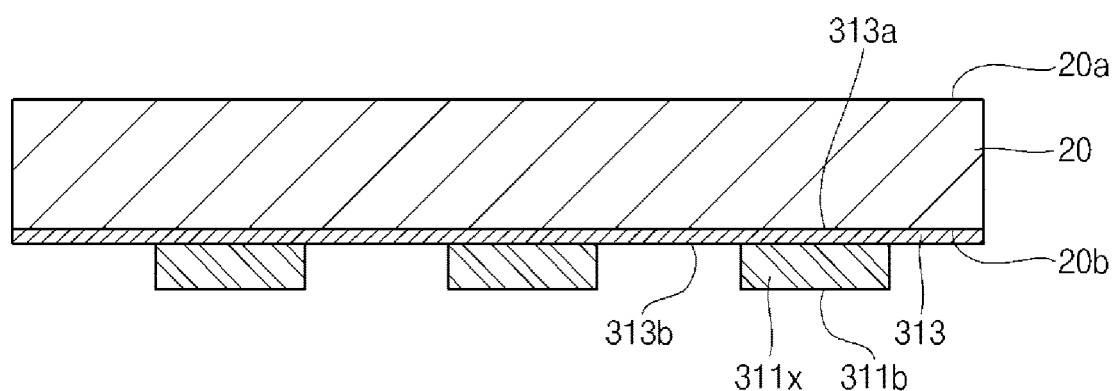

FIG. 14B illustrates a cross-sectional view of carrier substrate 20 and metal film 313 after additional processing in accordance with a land forming process of operational step S11e. In accordance with the present embodiment, a masking layer (not shown) is disposed over bottom surface 313b of metal film 313. In one embodiment, the masking layer includes portions covering parts of bottom surface 313b where grooves are to be provided. Next, a plurality of lands 311x can be formed on bottom surface 313b using, for example, an electroplating process that uses the exposed parts of metal film 313 as seed regions. After lands 311x are formed to a desired thickness, the masking layer can be removed. In one embodiment, the masking layer has a thickness that is equal to or greater than the desired thickness of lands 311x. In one embodiment, lands 311x can comprise copper or a copper alloy or other suitable conductive materials.

Figure 14C:
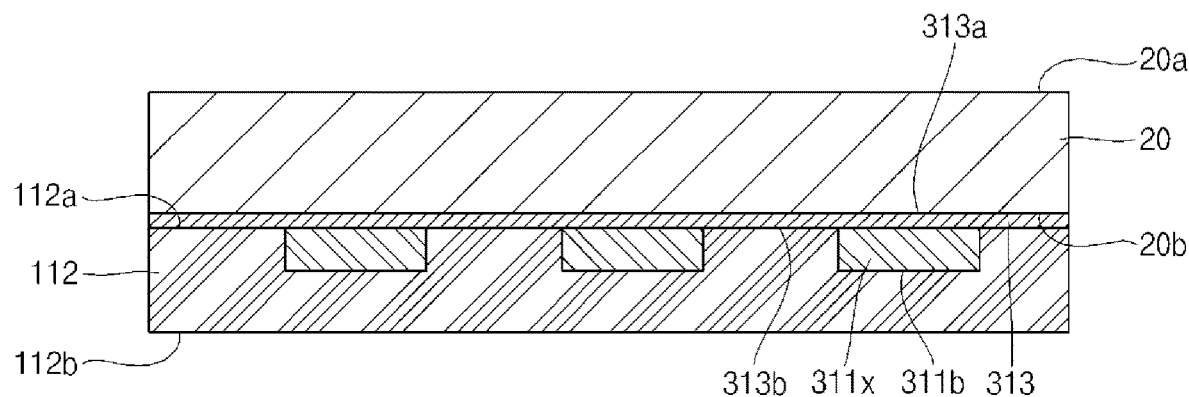

FIG. 14C illustrates a cross-sectional view of carrier substrate 20, metal film 313 and lands 311x after further processing in accordance with resin forming operational step S12 of FIG. 13. In one embodiment, a molding process is used to form resin 112 to cover or encapsulate bottom surface 313b of metal film 313 exposed to the outside through lands 311x. In one embodiment, resin 112 is disposed to cover all of bottom surfaces 313b of metal film 313 and lands 311x. In one embodiment, resin 112 comprises an electrically insulating material, which may be cured using, for example, a baking process or other post mold curing processes.

Figure 14D:
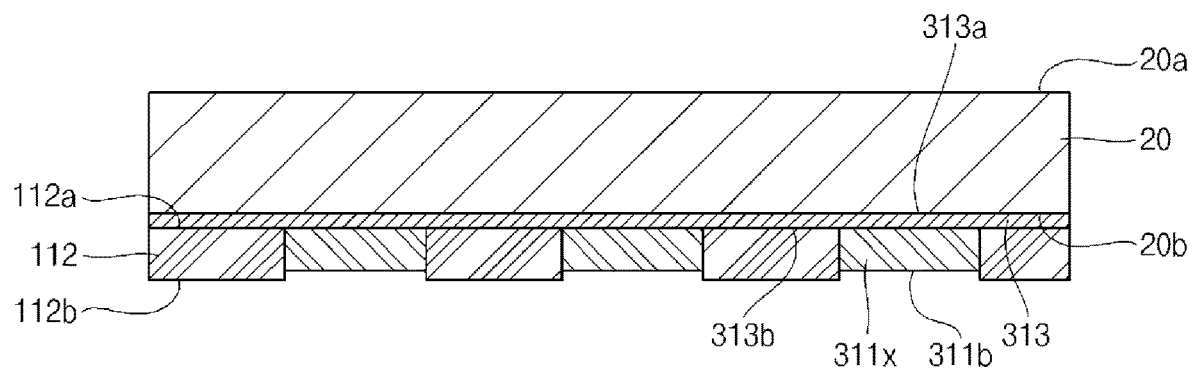

FIG. 14D illustrates a cross-sectional view of carrier substrate 20, lands 313x, and resin 12 after additional processing in accordance a resin removal operational step S13 of FIG. 13. In one embodiment, a grinding process is used to more resin 112 from bottom surface 112b to expose bottom surfaces 311b of lands 311x to the outside. In one embodiment, when bottom surface 112b of resin 112 is removed through grinding and bottom surfaces 311b of lands 311x are exposed to the outside, portions of bottom surfaces 311b of lands 311x can be removed using an etching or soft etching process. In one embodiment, the etching step recesses bottom surfaces 311b of lands 311x with respect bottom surface 112b of resin 112. This results in bottom surfaces 311b being offset inward or stepped inward with respect to bottom surface 112b.

Figure 14E:
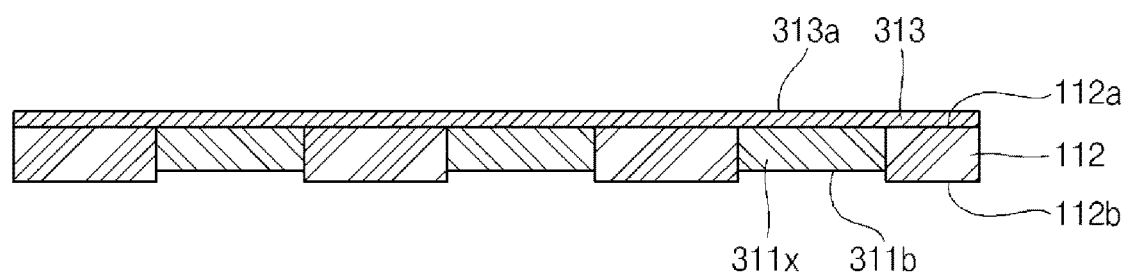

FIG. 14E illustrates a cross-sectional view of lands 311x, metal film 313, and resin 112 after further processing in accordance with a removal of carrier operational step S14e of FIG. 13. In one embodiment, carrier substrate 20 is separated from top surface 313a of metal film 313 and any adhesive remaining on top surface 313a can be removed using a cleaning process. In an alternative embodiment, carrier substrate can be removed using a grinding and/or etching process.

Figure 14F:
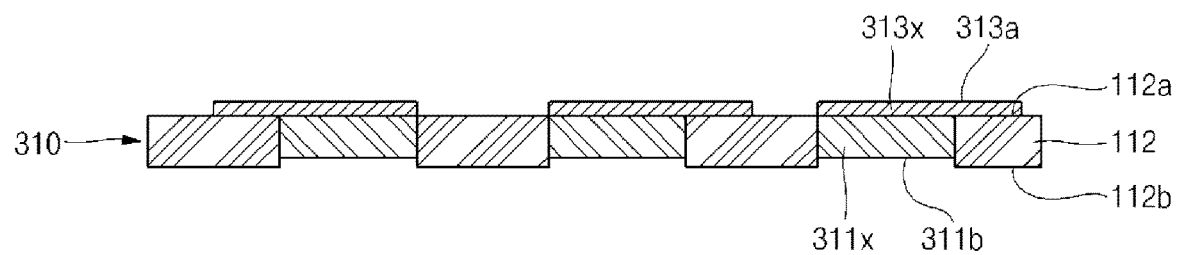

FIG. 14F illustrates a cross-sectional view of lands 311x, metal film 313, and resin 112 after further processing in accordance with a conductive thin film patterning operational step S15e of FIG. 13 to provide molded substrate 310. In one embodiment, a plurality of conductive patterns 313x is formed by patterning metal thin film 313 from the top surface 313a. In one embodiment, a masking layer is formed over resin layer 112 and bottom surfaces of lands 311, and a patterned masking layer is formed over top surface 313a of metal film 313. In one embodiment, an etching process can be used to remove unmasked portions of metal film 313 to provide conductive patterns 313x in a desired configuration. Both masking layers can then be removed to provide molded substrate 310. In accordance with the present embodiment, conductive patterns 313x are on or overlap and are electrically connected to respective lands 313x and, in some embodiments, further are on or overlap resin 112 as generally illustrated in FIG. 14F.

Figure 14G:
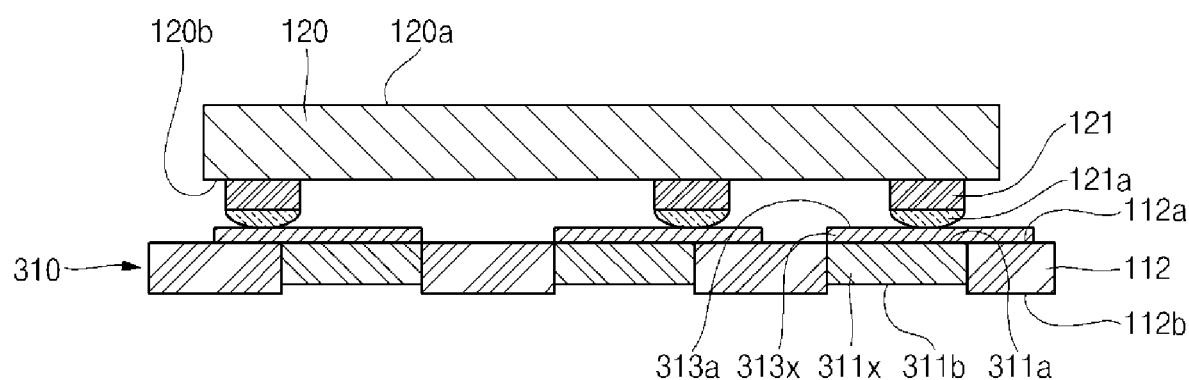

FIG. 14G illustrates a cross-sectional view of molded substrate 310 after additional processing in accordance with the attachment or mounting of an electronic component 120, such as a semiconductor die 120 operation S2 of FIG. 13. In one embodiment, a semiconductor die 120 is mounted to or electrically connected to top surfaces 313a of conductive patterns 313x of molded substrate 310. In one embodiment, semiconductor die 120 may be mounted to conductive patterns 313x using attachment techniques, such as flip chip bonding, temperature compression (TC) bonding, temperature compression non-conductive paste (TCNCP) bonding techniques, or other techniques as known to those of ordinary skill the art. In one embodiment, semiconductor die 120 has a first surface 120a, such as a top surface, and a second surface 120b, such as a bottom surface, opposite to first surface 120a. A plurality of conductive bumps 121 is provided on second surface 120b, which is facing conductive patterns 313x. In accordance with the present embodiment, semiconductor die 120 is electrically connected to conductive patterns 313x through the plurality of conductive bumps 121. In some embodiments, each conductive bump 121 may further include a solder cap 121a at a distal end part to facilitate attached to conductive pattern 113. In some embodiments, each conductive bump 121 can comprise a conductive pillar, a Kappa pillar, a conductive ball, a solder ball, or a Kappa ball, combinations thereof, or other similar conductive structures as known to those of ordinary skill in the art. Semiconductor die 120 can be an integrated circuit device, a sensor device, a discrete device, optic device, or another electronic device compatible with the configuration of molded substrate 310.

Figure 14H:
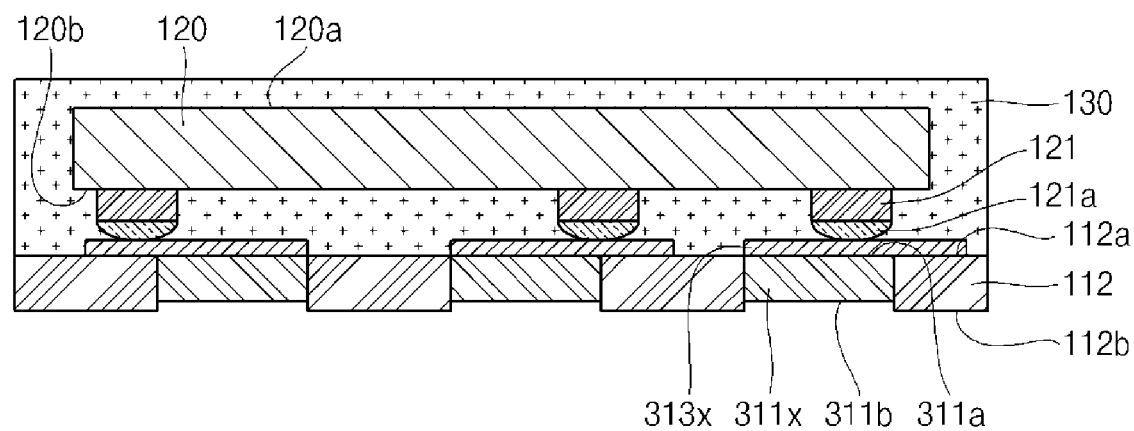

FIG. 14H illustrates a cross-sectional view of molded substrate 310 and semiconductor die 120 after additional processing in accordance with an encapsulation or molding operation S3 of FIG. 13. In one embodiment, a molding process is used to encapsulate the top surface of molded substrate 310 to form an encapsulant 130 or package body 130 of semiconductor package 300. In one embodiment, encapsulant 130 covers or encapsulates semiconductor die 120, conductive patterns 313x, and top surface 112a of resin 112. Encapsulant 130 is configured to electrically isolate and physically protect conductive patterns 313x, conductive bumps 121, and semiconductor die 120. In other embodiments, an underfill layer or region (not shown) can be provided between semiconductor die 120 and conductive patterns 313x.

Figure 14I:
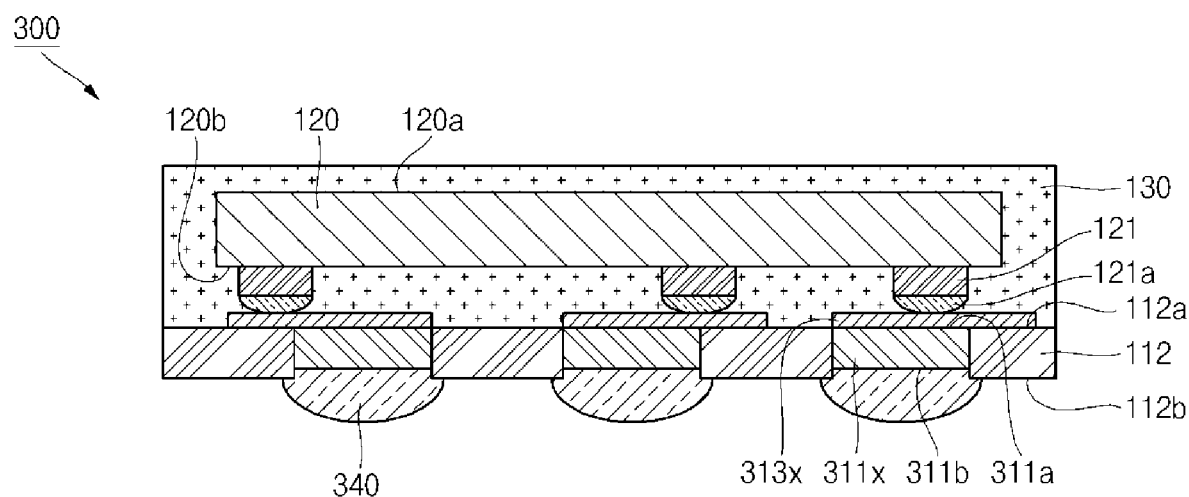

FIG. 14I illustrates a cross-sectional of a semiconductor package 300 after additional processing in accordance with a conductive bump attachment operation S4 of FIG. 13. In one embodiment, conductive bumps 340 can be formed or attached to bottom surfaces 311b of lands 311x. In accordance with the present embodiment, conductive bumps 340 can be configured at output pads for semiconductor package 300 to facilitate the attachment of semiconductor package 300 to a next level of assembly. By way of example, conductive bumps 340 can comprise conductive pillars, Kappa pillars, conductive balls, solder balls, conductive bumps, Kappa balls, or other similar conductive structures as known to those of ordinary skill in the art.

Figure 15A:
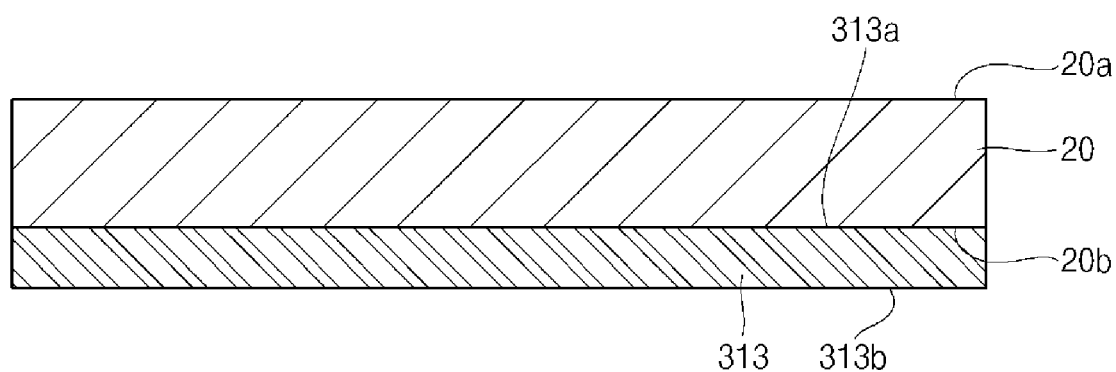
FIGS. 15A and 15B are sectional views for preparing a conductive thin film and forming a land in accordance with a further embodiment of the present invention.
Figure 15B:
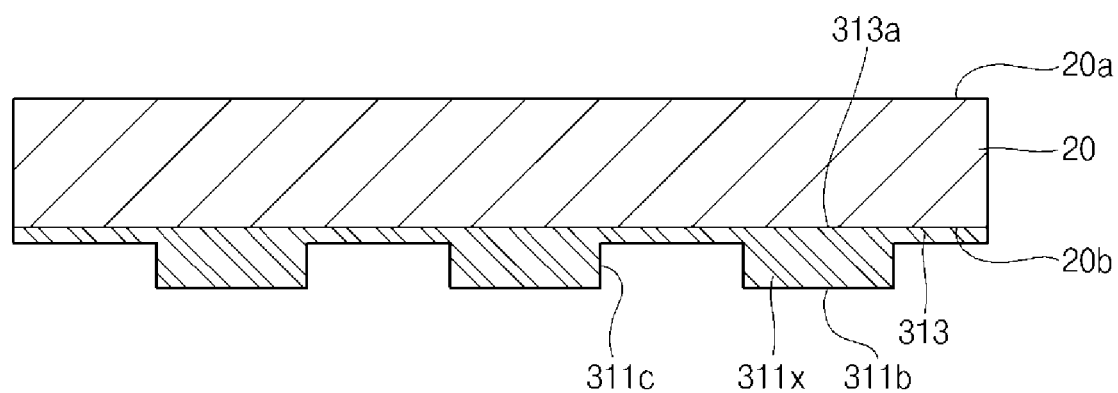

Turning now to FIGS. 15A and 15B, which are cross-sectional views of another conductive substrate structure, an alternative method for forming lands 311x in operational step S11e of operation S1e will be described. In operational step S10e a substrate 313 or conductive substrate 313, such as a metal substrate 313 or metal film 313 is provided having a generally flat top surface 313a and an opposing generally flat bottom surface 313b. In one embodiment, top surface 313a is attached to bottom surface 20b of carrier substrate 20 using, for example, an adhesive layer or a bonding layer. In an alternative embodiment, conductive substrate 313 can be deposited onto carrier substrate 20. In one embodiment, conductive substrate 313 has a thickness from about 80 microns to about 120 microns. In one embodiment, conductive substrate 313 has a thickness of about 100 microns. Carrier substrate 20 can comprise similar materials as those described previously in conjunction with FIG. 14A.

FIG. 15B illustrates a cross-sectional view of conductive substrate 313 and carrier substrate 20 after additional processing in accordance with a land formation operational step S11e of FIG. 13. In one embodiment, a plurality of grooves 311c with a predetermined depth is formed in the direction of the top surface 313a from the bottom surface 313b of conductive substrate 313. In one embodiment, plurality of grooves 311c can be formed in an area other than an area where plurality of lands 311x is to be formed. In one embodiment, grooves 311c may be selectively formed by partially-etching an area other than an area where the plurality of lands 311x are to be formed using, for example, a patterned masking layer (not shown). In accordance with the present embodiment, a portion of conductive substrate 313 remains after the partial etching step, and the remaining portion of conductive substrate can be used to subsequently form conductive patterns 313x in operational step S15e. In this configuration, conductive patterns 313x and lands 311x are formed from a unitary piece of material (i.e., conductive substrate 313). Then, when the plurality of grooves 311c is formed, bottom surface 313b of an area protruding from the metal thin film 313 toward a lower part becomes bottom surface 311b of each of lands 311x. In one embodiment, conductive substrate 313 can be copper, a copper alloy, or other suitable conductive materials as known to those of ordinary skill in the art.

Carrier substrate 20, conductive substrate 313, and lands 311x can be further processing using the operational steps of operation S1e. Other operations are similar to the molding of resin 112 in operational step S12, removing portions of resin 112 in operational step S13, the removing carrier substrate 20 in operational step S14e, the patterning of the conductive thin film in operational step S15e, the mounting of the semiconductor die in operation S2, the performing of the encapsulation operation in operation S3, and the attaching of the first conductive bump in operation S4, which are illustrated in FIGS. 14C to 14I.

In relation to a semiconductor package and a manufacturing method thereof according to the present disclosure, a fine thin film conductive pattern may be freely formed on a metal substrate and the top surface of a resin by using the metal substrate as a seed and a fine pitch implementation may be possible. In one embodiment, pad widths and pad spacing of less than or equal about 40 microns are supported. It is understood though that the present embodiments can be used with other pad spacing and pad width dimensions as well.

Additionally, in relation to a semiconductor package and a manufacturing method thereof according to the present disclosure, the total thickness of a semiconductor package may be reduced by using a plurality of pads formed through etching as output pads and its manufacturing cost may be saved.

From all of the foregoing, one skilled in the art can determine that, according to one embodiment, a method for making a semiconductor package comprises forming lands protruding toward an upper part on a conductive substrate having a substantially planar bottom surface, wherein a plurality of grooves separates the lands. The method includes forming a resin to fill the plurality of grooves, the resin on or overlapping top surfaces of the lands. The method includes removing portions of the conductive substrate from the bottom surface to define bottom surfaces of the lands and to expose the resin. The method includes removing the resin to expose the top surfaces of the lands and forming conductive patterns on or overlapping and electrically coupled to the top surfaces of the lands. The method includes attaching a semiconductor die to the conductive patterns and forming a package body encapsulating the semiconductor die, portions of a top surface of the resin, and at least portions of the conductive patterns.

From all of the foregoing, one skilled in the art can determine that, according to another embodiment, a manufacturing method of a semiconductor package comprises performing a land formation operation for forming a plurality of lands protruding toward a lower part on a conductive substrate having a flat bottom surface to form a plurality of grooves that are separated spaces of the plurality of lands. The method includes performing a molding operation for forming an insulating layer to fill all the plurality of grooves that are the separated spaces of the plurality of lands. The method includes a performing a conductive thin film patterning operation for patterning the conductive thin film to have a plurality of conductive patterns. The method includes performing a semiconductor die mounting operation for mounting a semiconductor die to allow a second conductive bump of a semiconductor die to be electronically connected to the plurality of conductive patterns. The method includes performing an encapsulation operation for forming an encapsulant to cover a top surface of a substrate formed of the plurality of lands, the insulating layer, and the conductive pattern and to cover the semiconductor die.

In another embodiment, before performing the land formation operation, the method can further comprise forming conductive thin film on bottom surface of a carrier. In a further embodiment, performing the land formation operation can comprise forming the plurality of lands by selectively depositing a conductive material on a bottom surface of the conductive thin film. In a still further embodiment, performing of the molding operation comprises forming the insulating layer to fill the plurality of grooves and to cover all bottom surfaces of the plurality of lands. In another embodiment, after performing the molding operation, the method can further comprise removing a bottom surface of the insulating layer to expose bottom surfaces of the plurality of lands to the outside and separating the carrier from a top surface of the conductive thin film. In a further embodiment, after performing the molding operation, the method can further comprise attaching conductive bumps to bottom surfaces of the plurality of lands. In a still further embodiment, performing the conductive thin film patterning operation can include forming a plurality of conductive patterns by patterning the conductive thin film through etching to selectively expose the insulating layer on a top surface of the conductive thin film. In another embodiment, performing the land formation operation comprises forming a plurality of grooves with a predetermined depth through partial-etching from a bottom surface of the conductive thin film toward an upper direction to form a plurality of lands protruding toward a lower part.

In view of all of the above, it is evident that a novel structure and method is disclosed. Included, among other features, is a molded substrate having a plurality of conductive lands within an insulating layer. Conductive patterns are disposed on top land surfaces and, in some embodiments on a top surface of the insulating layer. An electronic device is electrically connected to the conductive patterns and a package body encapsulates the electronic device and at least portions of the conductive pattern and at least portions of the top surface of the insulating layer. Also, the bottom surface of the insulating layer and the land bottom surfaces are disposed in different planes. Additionally, in one embodiment, the land top surfaces advantageously are used as seed regions for depositing the conductive patterns on the molded substrate.

While the present invention has been particularly illustrated and described with reference to exemplary embodiments thereof, it will be understood by those of ordinary skill in the art that various changes in form and details can be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

What is claimed is:

1. A method of forming an electronic component, comprising:
   providing lands that are laterally separated by spaces, the lands comprising a conductor, land top surfaces, and land bottom surfaces opposite to the land top surfaces;
   forming an insulator within the spaces, the insulator having an insulator top surface and an insulator bottom surface, the insulator top surface covering each of the land top surfaces, wherein:
      the land bottom surfaces are exposed through the insulator bottom surface;
   removing the insulator from the insulator top surface to expose the land top surfaces to provide a substrate having a substrate top surface adjacent to the land top surfaces and a substrate bottom surface adjacent to the land bottom surfaces;

depositing conductive patterns over the substrate top surface and coupled to the land top surfaces;
coupling an electronic device to the conductive patterns; and
forming a package body encapsulating the substrate top surface, at least portions of the electronic device, and at least portions of the conductive patterns,
wherein:
providing the lands comprises:
providing a work piece having a work piece top side and a work piece bottom side;
selectively removing portions of the work piece extending inward from the work piece top side to define the spaces; and
after forming the insulator and before removing the insulator from the insulator top surface:
first, globally removing a first portion of the work piece from the work piece bottom side; and
second, selectively removing a second portion of the work piece from the work piece bottom side to expose the insulator bottom surface and to define the land bottom surfaces.

2. The method of claim 1, wherein:
removing the insulator comprises providing the substrate top surface substantially co-planar with the land top surfaces.

3. The method of claim 1, further comprising:
providing an offset between the land bottom surfaces and the insulator bottom surface so that the insulator bottom surface is recessed inward with respect to the land bottom surfaces; and
forming conductive bumps over the land bottom surfaces, wherein:
the lands comprise side surfaces exposed from the insulator proximate to the insulator bottom surface; and
the conductive bumps contact the side surfaces and the insulator bottom surface.

4. The method of claim 1, further comprising:
providing an offset between each of the land bottom surfaces and the insulator bottom surface so that the land bottom surfaces are recessed inward with respect to the insulator bottom surface.

5. The method of claim 1, further comprising:
providing an offset between the land bottom surfaces and the insulator bottom surface so that the insulator bottom surface is recessed inward with respect to the land bottom surfaces.

6. The method of claim 1, further comprising:
forming conductive bumps over the land bottom surfaces.

7. The method of claim 1, wherein:
forming the insulator comprises forming a molded resin insulator.

8. The method of claim 1, wherein:
forming the conductive patterns comprises:
forming a masking layer on at least portions of the insulator top surface; and
electroplating the conductive patterns using the land top surfaces as seed regions.

9. The method of claim 1, wherein:
coupling the electronic device comprises attaching a semiconductor component to the conductive patterns in a flip-chip configuration.

10. The method of claim 1, wherein:
coupling the electronic device comprises coupling the electronic device comprising a first major surface, a second major surface opposite to the first major surface, and a side surface connecting the first major surface to the second major surface;
the side surface of the electronic device defines a perimeter; and
all the lands are inside the perimeter and are external interconnect structures for the electronic component.

11. A method for forming an electronic component, comprising:
providing lands that are laterally separated by spaces, the lands having land top surfaces, opposing land bottom surfaces, and comprising a conductor;
forming an insulator within the spaces, the insulator having an insulator top surface and an insulator bottom surface, the insulator top surface covering the land top surfaces, wherein:
the land bottom surfaces are exposed through the insulator bottom surface;
reducing thickness of the insulator from the insulator top surface inward to provide a reduced thickness insulator top surface, wherein:
the land top surfaces are exposed in the reduced thickness insulator top surface;
forming conductive patterns over the reduced thickness insulator top surface and coupled to the land top surfaces;
coupling an electronic device to the conductive patterns; and
forming a package body encapsulating at least portions of the electronic device;
wherein:
coupling the electronic device comprises coupling a semiconductor component to the conductive patterns in a flip-chip configuration;
the semiconductor component comprises a first major surface, a second major surface opposite to the first major surface, and a side surface connecting the first major surface to the second major surface;
the side surface of the semiconductor component define a perimeter; and
all the lands of the electronic component are inside the perimeter and external interconnects for the electronic component.

12. The method of claim 11, wherein:
providing the lands comprises:
providing a substrate having a substrate top surface and an opposing substrate bottom surface; and
selectively removing portions of the substrate extending inward from the substrate top surface to define the spaces; and
the method further comprises removing part of the substrate from the substrate bottom surface before reducing the thickness of the insulator.

13. The method of claim 11, further comprising:
providing an offset between the land bottom surfaces and the insulator bottom surface so that the land bottom surfaces are recessed inward with respect to the insulator bottom surface.

14. The method of claim 11, further comprising:
providing an offset between the land bottom surfaces and the insulator bottom surface so that the insulator bottom surface is recessed inward with respect to the land bottom surfaces.

15. The method of claim 14, further comprising:
providing conductive bumps over the land bottom surfaces,
wherein:

the lands comprise side surfaces exposed from the insulator proximate to the insulator bottom surface; and the conductive bumps contact the side surfaces and the insulator bottom surface.

16. A method for forming an electronic component, comprising:

providing a carrier substrate comprising a first surface, an opposing second surface, and a conductive film over the opposing second surface;

providing lands adjacent to the conductive film, the lands laterally separated by spaces, the lands having land top surfaces adjacent to the conductive film and opposing land bottom surfaces;

providing an insulator within the spaces and having an insulator top surface and an insulator bottom surface, wherein the land bottom surfaces are exposed through the insulator bottom surface;

removing the carrier substrate while leaving the conductive film in place adjacent to the land top surfaces;

patterning the conductive film to provide conductive patterns coupled to the land top surfaces;

coupling an electronic device to the conductive patterns; and forming a package body encapsulating at least portions of the electronic device.

17. The method of claim 16, wherein:

providing the carrier substrate comprises providing the carrier substrate comprising a semiconductor material;

providing the carrier substrate comprises depositing the conductive film over the second surface; and providing the lands comprises:

providing a mask over the conductive film with openings that expose portions of the conductive film where the lands are to be formed; and electroplating the lands using the conductive film as a seed layer.

18. The method of claim 16, further comprising:

providing an offset between the land bottom surfaces and the insulator bottom surface so that the land bottom surfaces are recessed inward with respect to the insulator bottom surface.

19. The method of claim 16, further comprising:

providing an offset between the land bottom surfaces and the insulator bottom surface so that the insulator bottom surface is recessed inward with respect to the land bottom surfaces.

20. The method of claim 16, further comprising:

forming conductive bumps over the land bottom surfaces.

\* \* \* \* \*